(12) United States Patent
Du et al.

(10) Patent No.: US 11,777,023 B2
(45) Date of Patent: Oct. 3, 2023

(54) SEMICONDUCTOR DEVICE AND METHOD FOR MANUFACTURING THE SAME

(71) Applicant: Innoscience (Suzhou) Technology Co., Ltd., Suzhou (CN)

(72) Inventors: Weixing Du, Suzhou (CN); Jheng-Sheng You, Suzhou (CN)

(73) Assignee: Innoscience (Suzhou) Technology Co., Ltd., Suzhou (CN)

( * ) Notice: Subject to any disclaimer, the term of this patent is extended or adjusted under 35 U.S.C. 154(b) by 555 days.

(21) Appl. No.: 17/054,515

(22) PCT Filed: Oct. 20, 2020

(86) PCT No.: PCT/CN2020/122263
§ 371 (c)(1),
(2) Date: Nov. 10, 2020

(87) PCT Pub. No.: WO2022/082452
PCT Pub. Date: Apr. 28, 2022

(65) Prior Publication Data
US 2022/0302295 A1 Sep. 22, 2022

(51) Int. Cl.
*H01L 29/778* (2006.01)
*H01L 29/66* (2006.01)
(Continued)

(52) U.S. Cl.
CPC ...... *H01L 29/7787* (2013.01); *H01L 29/1075* (2013.01); *H01L 29/157* (2013.01);
(Continued)

(58) Field of Classification Search
CPC ............. H01L 29/7787; H01L 29/2003; H01L 29/7788; H01L 21/761; H01L 29/7786;
(Continued)

(56) References Cited

U.S. PATENT DOCUMENTS 8,866,192 B1 10/2014 Chen et al.
10,163,707 B2 12/2018 Chang
(Continued)

FOREIGN PATENT DOCUMENTS

CN 101013724 A 8/2007
CN 103531615 A 1/2014
(Continued)

OTHER PUBLICATIONS

Notice of Allowance of the corresponding China patent application No. 202080003405.4 dated Jun. 9, 2022.
(Continued)

*Primary Examiner* — David Vu
*Assistant Examiner* — Brandon C Fox
(74) *Attorney, Agent, or Firm* — JCIPRNET

(57) ABSTRACT

A semiconductor device includes a substrate, a first GaN-based high-electron-mobility transistor (HEMT), a second GaN-based HEMT, a first interconnection, and a second interconnection is provided. The substrate has a plurality of first-type doped semiconductor regions and second-type doped semiconductor regions. The first GaN-based HEMT is disposed over the substrate to cover a first region on the first-type doped semiconductor regions and the second-type doped semiconductor regions in the substrate. The second GaN-based HEMT is disposed over the substrate to cover a second region. The first region is different from the second region. The first interconnection is disposed over and electrically connected to the substrate, forming a first interface. The second interconnection is disposed over and electrically connected to the substrate, forming a second interface. The first interface is separated from the second interface by at least two heterojunctions formed in the substrate.

25 Claims, 23 Drawing Sheets

(51) Int. Cl.
  *H01L 29/20* (2006.01)
  *H01L 29/10* (2006.01)
  *H01L 29/26* (2006.01)
  *H01L 29/15* (2006.01)

(52) U.S. Cl.
  CPC .......... *H01L 29/2003* (2013.01); *H01L 29/26* (2013.01); *H01L 29/66431* (2013.01); *H01L 29/66462* (2013.01); *H01L 29/778* (2013.01); *H01L 29/7786* (2013.01); *H01L 29/7788* (2013.01)

(58) Field of Classification Search
  CPC ... H01L 29/1075; H01L 29/157; H01L 29/26; H01L 29/66431; H01L 29/66462; H01L 29/778
  See application file for complete search history.

(56) References Cited

U.S. PATENT DOCUMENTS

| | | | |
|---|---|---|---|
| 2011/0210377 | A1* | 9/2011 | Haeberlen ........... H01L 27/0605 257/E21.403 |
| 2014/0048850 | A1* | 2/2014 | Jeon ................. H01L 29/66462 257/195 |
| 2016/0262228 | A1 | 9/2016 | Huang et al. |
| 2018/0076287 | A1* | 3/2018 | Ohguro ............... H01L 29/2003 |
| 2019/0140088 | A1* | 5/2019 | Cheng ............... H01L 21/02381 |
| 2019/0288101 | A1 | 9/2019 | Longobardi et al. |
| 2020/0144382 | A1 | 5/2020 | Chen et al. |

FOREIGN PATENT DOCUMENTS

| | | |
|---|---|---|
| CN | 103745989 A | 4/2014 |
| CN | 105336771 A | 2/2016 |
| CN | 106024878 A | 10/2016 |
| CN | 106941117 B | 7/2019 |
| JP | 411769 A | 1/1992 |

OTHER PUBLICATIONS

International Search Report and Written Opinion of the corresponding PCT application No. PCT/CN2020/122263 dated Jul. 22, 2021.
First Office Action of the corresponding China patent application No. 202080003405.4 dated Mar. 23, 2022.

* cited by examiner

SEMICONDUCTOR DEVICE AND METHOD FOR MANUFACTURING THE SAME

FIELD OF THE INVENTION

The present invention generally relates to a semiconductor device. More specifically, the present invention relates to a high electron mobility transistor (HEMT) semiconductor device with a doped substrate.

BACKGROUND OF THE INVENTION

In recent years, intense research on high-electron-mobility transistors (HEMTs) has been prevalent for semiconductor devices, such as high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HMET devices, thereby making them suitable for mass production.

SUMMARY OF THE INVENTION

In accordance with one aspect of the present disclosure, a semiconductor device with a substrate having a plurality of first-type doped semiconductor regions and second-type doped semiconductor regions is provided. The semiconductor device includes the substrate, a first GaN-based high-electron-mobility transistor (HEMT), a second GaN-based HEMT, a first interconnection, and a second interconnection. The first-type doped semiconductor regions and the second-type doped semiconductor regions extend along a first direction, and alternately arranged along a second direction, which is different from the first direction. The first GaN-based HEMT is disposed over the substrate to cover a first region on the first-type doped semiconductor regions and the second-type doped semiconductor regions in the substrate. The first GaN-based HEMT has a first heterojunction area being disposed between two nitride-based semiconductor layers with a two-dimensional electron gas (2DEG) region adjacent to the first heterojunction. The second GaN-based HEMT is disposed over the substrate to cover a second region on the first-type doped semiconductor regions and the second-type doped semiconductor regions in the substrate. The second GaN-based HEMT has a second heterojunction area being disposed between the two nitride-based semiconductor layers with another 2DEG region adjacent to the second heterojunction. The first region is different from the second region. The first interconnection is disposed over the substrate. The first interconnection passes through the two nitride-based semiconductor layers and electrically connected to the substrate. A portion of the first region forms a first interface with the first interconnection. The second interconnection is disposed over the substrate. The second interconnection passes through the two nitride-based semiconductor layers and electrically connected to the substrate. A portion of the second region forms a second interface with the second interconnection. The first interface is separated from the second interface by at least two heterojunctions formed in the substrate.

In accordance with another aspect of the present disclosure, a semiconductor device with a substrate having a plurality of first type doped semiconductor regions and second type doped semiconductor regions is provided. The first type doped semiconductor regions and the second type doped semiconductor regions are alternately arranged. The semiconductor device includes the substrate, a first nitride-based semiconductor layer, a second nitride-based semiconductor layer, a pair of first source/drain (S/D) electrodes, a first gate electrode, a pair of second S/D electrodes, a second gate electrode, a first interconnection, and a second interconnection. The first nitride-based semiconductor layer is disposed over the substrate. The second nitride-based semiconductor layer is disposed on the first nitride-based semiconductor layer, and the second nitride-based semiconductor layer has a bandgap that is greater than a bandgap of the first nitride semiconductor layer. The first S/D electrodes are disposed on the second nitride-based semiconductor layer. The first gate electrode is disposed on the second nitride-based semiconductor layer and between the first S/D electrodes. The second S/D electrodes are disposed on the second nitride-based semiconductor layer. The second gate electrode is disposed on the second nitride-based semiconductor layer and between the second S/D electrodes. The first interconnection is disposed over the second nitride-based semiconductor layer and penetrating the first and second nitride-based semiconductor layers to form a first interface with at least one of the first and second type doped semiconductor regions. The second interconnection is disposed over the second nitride-based semiconductor layer and penetrating the first and second nitride-based semiconductor layers to form a second interface with at least one of the first and second type doped semiconductor regions. The first interface is spaced apart from the second interface. A vertical projection of a portion of the first nitride-based semiconductor layer on the substrate is between the first and second interfaces and at least spans across a whole one of the first and second type doped semiconductor regions.

In accordance with still another aspect of the present disclosure, a method of manufacturing a semiconductor device is provided. The method includes forming a plurality of first type doped semiconductor regions and second type doped semiconductor regions with a plurality of heterojunctions in a substrate; forming a first nitride-based semiconductor layer above the substrate; forming a second nitride-based semiconductor layer on the first nitride-based semiconductor layer; forming a pair of first S/D electrodes and a pair of second S/D electrodes on the second nitride-based semiconductor layer; forming a first gate electrode and a second gate electrode on the second nitride-based semiconductor layer; removing portions of the first nitride-based semiconductor layer and the second nitride-based semiconductor layer to form a first trench and a second trench separated from each other, so as to expose a top portion of the substrate; forming first and second interconnections in the first and second trenches, respectively. The second nitride-based semiconductor layer has a band gap greater than a bandgap of the first nitride-based semiconductor layer. The first gate electrode is present between the first S/D electrodes. The second gate electrode is present between the second S/D electrodes. The first and second interconnections contact the top portion of the substrate, so as to form a first interface and a second interface. Vertical projections of the first and second interfaces on the substrate are at least separated from each other by at least two of the heterojunctions.

By applying such configuration above, the presence of the substrate having alternately arranged first and second type doped semiconductor regions advantageously improves the voltage of the semiconductor device. In the semiconductor device, the voltage of the second GaN-based HEMT can avoid being affected by the first GaN-based HEMT. In other words, the voltage difference of the substrate below the first gate electrode can be decreased while the voltage of the substrate below the second gate electrode is changing. Also, the first and second interconnections can control the voltage of the substrate through the first and second interfaces respectively without affecting each others.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
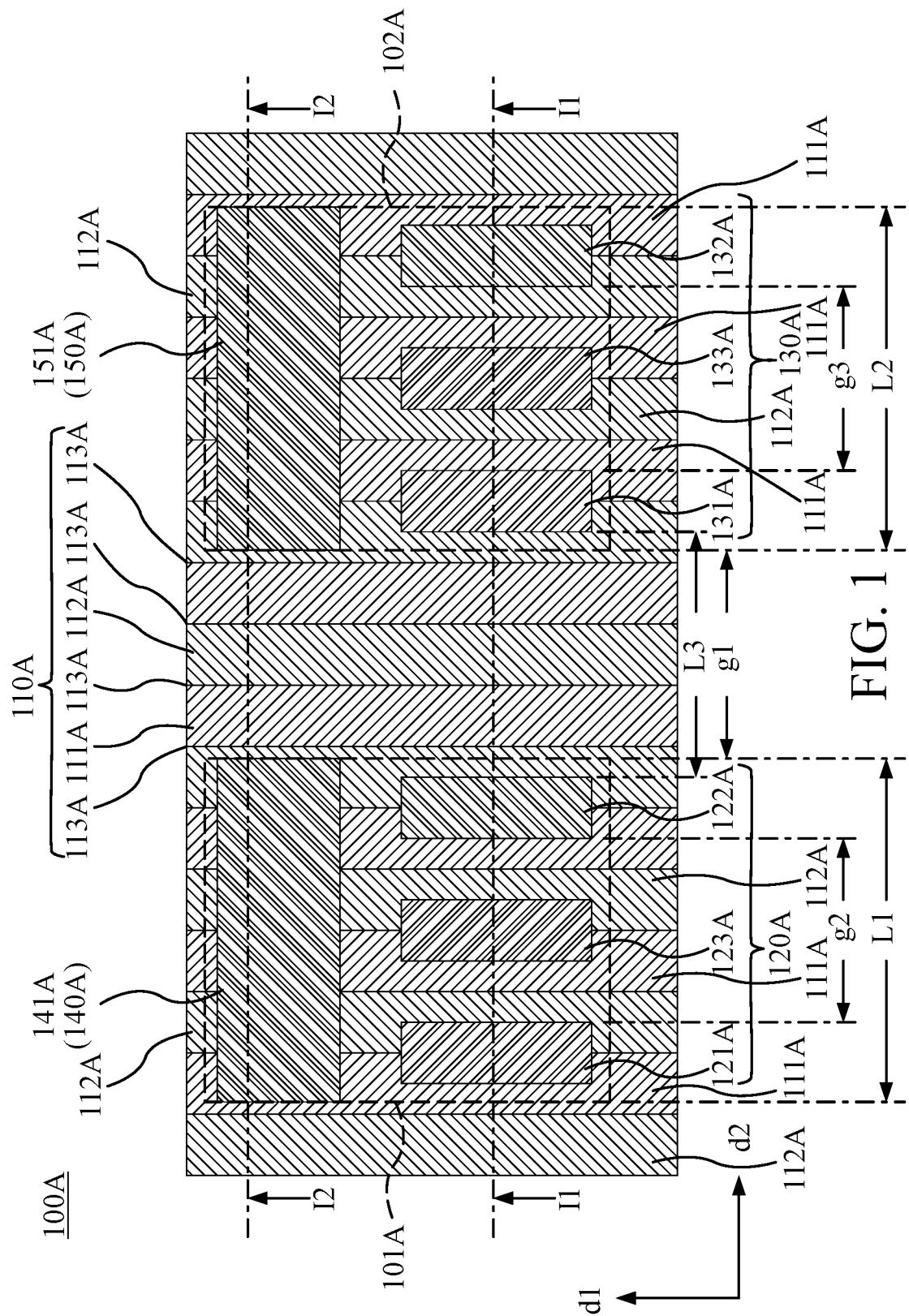
FIG. 1 is a top view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above", "below", "up", "left", "right", "down", "top", "bottom", "vertical", "horizontal", "side", "higher", "lower", "upper", "over", "under", and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of present disclosure are not deviated from such arrangement.

In the following description, semiconductor devices, methods for manufacturing the same, and the like are set forth as preferred examples. It will be apparent to those skilled in the art that modifications, including additions or substitutions may be made without departing from the scope and spirit of the invention. Specific details may be omitted so as not to obscure the invention; however, the disclosure is written to enable one skilled in the art to practice the etching herein without under experimentation.

FIG. 1 is a top view of a semiconductor device 100A according to according to some embodiments of the present disclosure, and, in order to clarify the features, some layers or components of the semiconductor device 100A are omitted in the figure. In this embodiment, the semiconductor device 100A has a substrate 110A, a GaN-based HEMT 120A, a GaN-based HEMT 130A, an interconnection 140A, and an interconnection 150A.

The substrate 110A has a plurality of first-type doped semiconductor regions 111A and a plurality of second-type doped semiconductor regions 112A. The first-type doped semiconductor regions 111A and the second-type doped semiconductor regions 112A extend lengthwise along the first direction d1. The first-type doped semiconductor regions 111A and the second-type doped semiconductor regions 112A are alternately arranged along the second direction d2. The second direction d2 is different from the first direction d1. For example, the first direction d1 and the second direction d2 in the embodiment are perpendicular to each others.

In the semiconductor device 100A, the GaN-based HEMT 120A and the GaN-based HEMT 130A are disposed over the substrate 110A. In one aspect, the GaN-based HEMT 120A covers a region 101A on the first-type doped semiconductor regions 111A and the second-type doped semiconductor regions 112A in the substrate 110A. The GaN-based HEMT 130A covers a region 102A on the first-type doped semiconductor regions 111A and the second-type doped semiconductor regions 112A in the substrate 110A. The region 101A is different from the region 102A. In the second direction d2, a gap g1 is positioned between the region 101A and the region 102A.

In this embodiment, the first-type doped semiconductor regions 111A and the second-type doped semiconductor regions 112A form a plurality of junctions 113A. The gap g1 between the region 101A and the region 102A spans across at least two junctions 113A. For example, the gap g1 of this embodiment spans across four junctions 113A.

Figure 2:
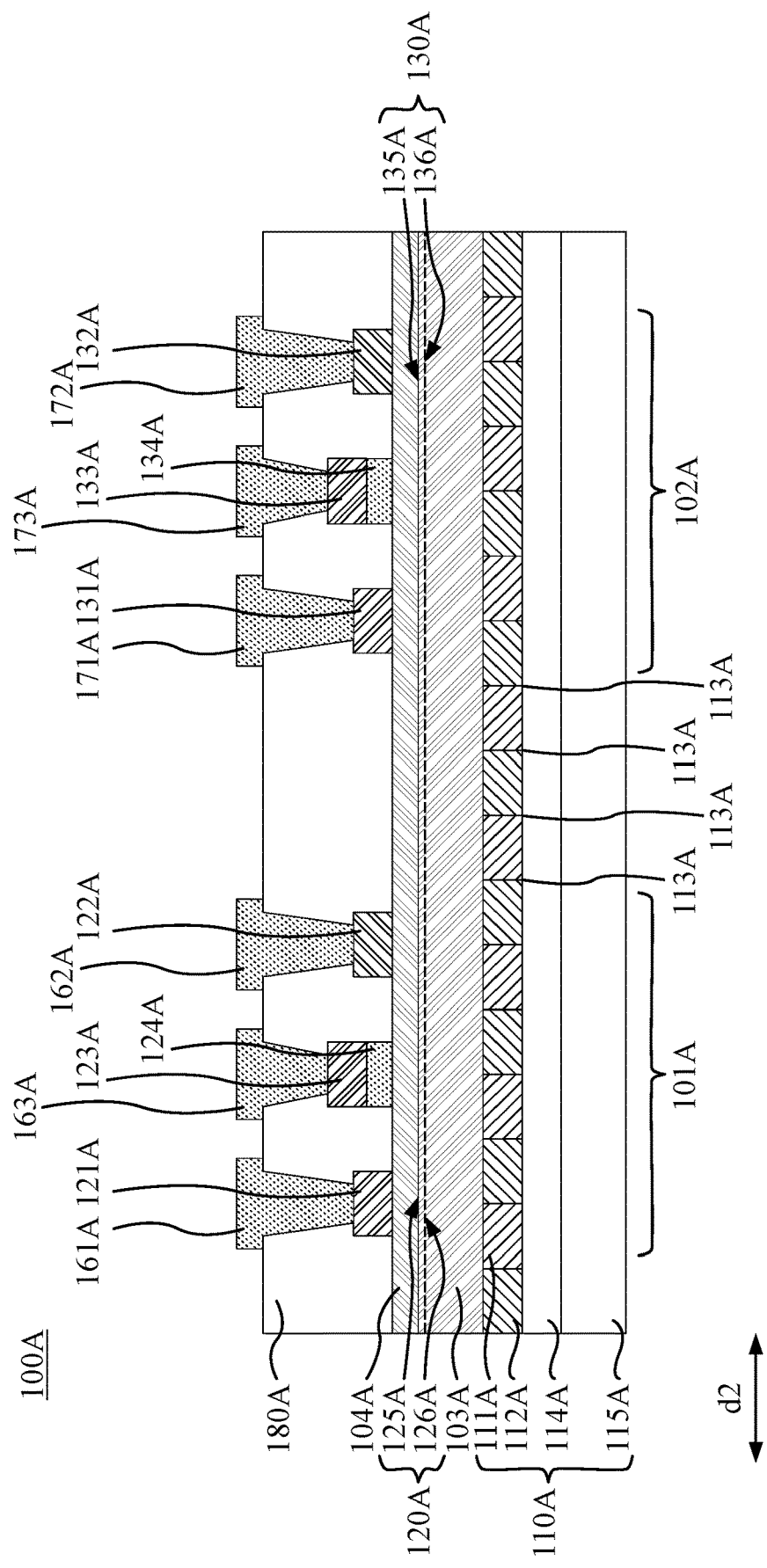
FIG. 2 is a side sectional view of the semiconductor device according to a cutting plan line I1 in FIG. 1.

FIG. 2 is a side sectional view of the semiconductor device 100A according to a cutting plan line I1 in FIG. 1. The GaN-based HEMT 120A of this embodiment has a heterojunction area 125A being disposed between two nitride-based semiconductor layers 103A, 104A. The GaN-based HEMT 120A has a 2DEG region 126A adjacent to the heterojunction area 125A. In other words, the heterojunction area 125A is the heterojunction between the two nitride-based semiconductor layers 103A, 104A in the region 101A.

The GaN-based HEMT 130A has a heterojunction area 135A being disposed between the two nitride-based semiconductor layers 103A, 104A. The GaN-based HEMT 130A has a 2DEG region 136A adjacent to the heterojunction area 135A. The heterojunction area 135A is the heterojunction between the two nitride-based semiconductor layers 103A, 104A in the region 102A.

In an embodiment, the nitride-based semiconductor layer 104A is disposed on the nitride-based semiconductor layer 103A. The nitride-based semiconductor layer 104A has a bandgap greater than a bandgap of the nitride semiconductor layer 103A. Therefore, the 2DEG regions 126A, 136A are formed in the regions 101A, 102A, respectively.

In this embodiment, four junctions 113A are located between the region 101A and the region 102A. Consequently, a voltage of the substrate 110A in the region 101A will not be affected by voltage changes in the region 102A.

Moreover, a pair of S/D electrodes 121A, 122A are disposed on the nitride-based semiconductor layer 104A. A gate electrode 123A is disposed on the nitride-based semiconductor layer 104A. The gate electrode 123A is disposed between the S/D electrodes 121A, 122A. A pair of S/D electrodes 131A, 132A are disposed on the nitride-based semiconductor layer 104A. A gate electrode 133A is disposed on the nitride-based semiconductor layer 104A. The gate electrode 133A is disposed between the S/D electrodes 131A, 132A. The S/D electrodes 121A, 122A and the gate electrode 123A are located in the region 101A. The S/D electrodes 131A, 132A and the gate electrode 133A are located in the region 102A. The voltage of the substrate 110A in the region 101A will not be affected while the voltage of the substrate 110A in the region 102A is changed by the S/D electrodes 131A, 132A and the gate electrode 133A.

For example, each of the S/D electrodes 121A, 122A, 131A, 132A includes one or more conformal conductive layers. In some embodiments, the S/D electrodes 121A, 122A, 131A, 132A can includes, for example but are not limited to, metals, alloys, doped semiconductor materials (such as doped crystalline silicon), other conductor materials, or combinations thereof. The exemplary materials of the S/D electrodes 121A, 122A, 131A, 132A can include, for example but are not limited to, Ti, AlSi, TiN, or combinations thereof. In some embodiments, each of the S/D electrodes 121A, 122A, 131A, and 132A forms ohmic contact with the nitride-based semiconductor layer 104. The ohmic contact can be achieved by applying Ti, Al, or other suitable materials for the S/D electrodes 121A, 122A, 131A, and 132A. In some embodiments, a dielectric layer (not illustrated), such as SiN, can be disposed between the nitride-based semiconductor layer 104 and the S/D electrodes 121A, 122A, 131A, and 132A.

Referring to FIG. 1, the interconnection 140A is disposed over the substrate 110A. The interconnection 150A is disposed over the substrate 110A. In one aspect, in the second direction d2, lengths of the interconnection 140A and the region 101A may be the same. Lengths of the interconnection 150A and the region 102A may also be the same in the second direction d2. Optionally, the lengths may be different depending upon the device application.

Figure 3:
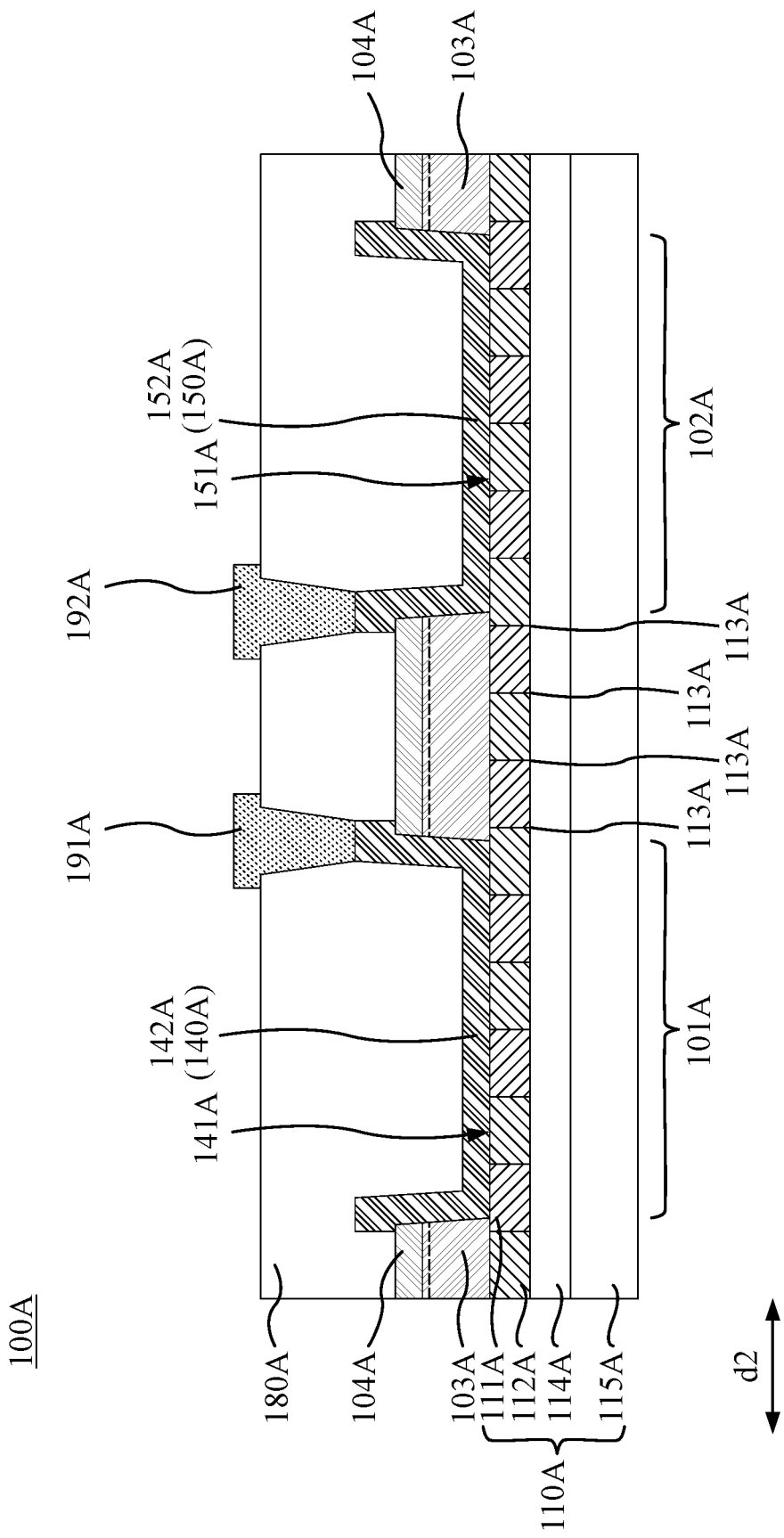
FIG. 3 is a side sectional view of the semiconductor device according to a cutting plan line I2 in FIG. 1.

FIG. 3 is a side sectional view of the semiconductor device according to a cutting plan line I2 in FIG. 1. The interconnection 140A is disposed over the substrate 110A. Some of the first-type doped semiconductor regions 111A and the second-type doped semiconductor regions 112A are located under the interconnection 140A. The interconnection 140A passes through the two nitride-based semiconductor layers 103A, 104A. The interconnection 140A is electrically connected to the substrate 110A. A portion of the region 101A forms an interface 141A with the interconnection 140A. In other words, the interconnection 140A connects the substrate 110A through the interface 141A.

The interconnection 150A is disposed over the substrate 110A. Some of the first-type doped semiconductor regions 111A and the second-type doped semiconductor regions 112A are located under the interconnection 150A. The interconnection 150A passes through the two nitride-based semiconductor layers 103A, 104A as well. The interconnection 150A is electrically connected to the substrate 110A. A portion of the region 102A forms an interface 151A with the interconnection 150A. In other words, the interconnection 150A connects the substrate 110A through the interface 151A.

Therefore, the voltage of the substrate 110A in the regions 101A, 102A can be independently controlled by the interconnections 140A, 150A, respectively. The voltage of the substrate 110A in the region 101A can remain in a selected range by applying electrical signals to interconnection 140A. The voltage of the substrate 120A in the region 102A can remain in a selected range by applying electrical signals to interconnection 150A. The voltage may be the same or different.

In contrast, when two GaN-based HEMTs are disposed on the same substrate without first-type and second-type doped semiconductor regions described above, it is difficult to operate each of the GaN-based HEMTs independently. Without the doped semiconductor regions, a substrate effect would occur such that the two GaN-based HEMTs might affect each other. As used herein, the substrate effect means the two GaN-based HEMTs share the same substrate voltage. As such, it is difficult to operate the two GaN-based HEMTs independently.

As seen in FIG. 3, the interface 141A is separated from the interface 151A by at least two junctions 113A. A vertical projection of a portion of the nitride-based semiconductor layer 103A on the substrate 110A is between the interfaces 141A, 151A. The portion of the nitride-based semiconductor layer 103A at least spans across two entire doped semiconductor regions 111A, 112A. For example, the interface 141A is separate from the interface 151A by four junctions 113A. The portion of the nitride-based semiconductor layer 103A between the interfaces 141A, 151A spans across two entire first-type doped semiconductor regions 111A and one entire second-type doped semiconductor region 112A. The voltage of the substrate 110A in region 101A will not be affected by the voltage in the region 102A.

In one aspect, the first-type doped semiconductor regions 111A may include p-type dopants. The second-type doped semiconductor regions 112A may include n-type dopants. The junctions 113A include at least two p-n junctions. The junctions 113A also include a p-n-p structures. In other words, the p-n-p structures between the region 101A and the region 102A form the two p-n junctions. For example, the semiconductor device 100A of this embodiment has four p-n junctions located between the region 101A and the region 102A. In other words, the gap g1 spans across four p-n junctions 113A. The vertical projection of the portion of the nitride-based semiconductor layer 103A on the substrate 110B spans across a p-n-p structure.

For example, the p-type dopants can include, for example but are not limited to, Be, Mg, Zn, Cd. The n-type dopants can include, for example but are not limited to, Si.

Referring to FIG. 1, the pair of S/D electrodes 121A, 122A are arranged along the second direction d2 with a source-drain spacing g2. The interface 141A has a length L1 along the second direction d2 greater than the source-drain spacing g2. The part of S/D electrodes 131A, 132A are arranged along the second direction d2 with a source-drain spacing g3. The interface 151A has a length L2 along the second direction d2 that may optionally be greater than the source-drain spacing g3. Other configurations may include the same spacing depending on the device application.

As a result of this configuration, the interconnection 140A can control the voltage under the S/D electrodes 121A, 122A. The interconnection 150A can control the voltage under the S/D electrodes 131A, 132A.

Moreover, the shortest distance, which is gap g1, from the interconnection 140A to the interconnection 150A may be less than the shortest distance L3 from the S/D electrodes 121A, 122A to the S/D electrodes 131A, 132A.

Referring to FIG. 2, the substrate 110A of the embodiment includes base layer 115A, and insulating layer 114A. The material of the base layer 115A may include silicon. Alternatively, the base layer may be germanium, silicon carbide, sapphire, or other known substrate materials. The insulating layer 114A is disposed on the base layer 115A and may be silicon dioxide, silicon nitride, mixtures thereof, or other known nitrides, oxides, or other insulator materials. The first-type doped semiconductor regions 111A and the second-type doped semiconductor regions 112A are disposed on the insulating layer 114. The insulating layer 114 can block current between the base layer 115A and the first and second-type doped semiconductor regions 111A and 112A. For example, the insulating layer 114 can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc), or combinations thereof.

In some embodiments, a nucleation layer can be disposed on the insulating layer 114A. The first and second-type doped semiconductor regions 111A and 112A can be formed on the nucleation layer. In some embodiments, a buffer layer can be disposed on the first and second-type doped semiconductor regions 111A and 112A. The nitride-based semiconductor layer 103A can be formed on the buffer layer.

The material of the first-type doped semiconductor regions 111A and the second-type doped semiconductor regions 112A may include GaN. In some embodiments, the first-type doped semiconductor regions 111A and the second-type doped semiconductor regions 112A may include, for example but not limited to, nitrides or group III-V compounds, such as GaN, GaAs, InN, AlN, InGaN, AlGaN, InAlGaN, or combinations thereof.

The material of the nitride-based semiconductor layer 103A may include GaN. The material of the nitride-based semiconductor layer 104A may include AlGaN. The bandgap of the nitride-based semiconductor layer 104A is greater than the bandgap of the nitride-based semiconductor layer 103A. Therefore, 2DEG regions 126A, 136A are formed. In some embodiments, the nitride-based semiconductor layers 103A, 104A may include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$, while the bandgap of the nitride-based semiconductor layer 104A is greater than the bandgap of the nitride-based semiconductor layer 103A, and a 2DEG is formed. Alternatively, other binary, ternary or quaternary III-V semiconductors may also be used as long as a difference in bandgaps creates a heterojunction and forms 2DEG regions in the respective devices.

The semiconductor device 100A further includes a passivation layer 180A and connecting pads 161A, 162A, 163A, 171A, 172A, and 173A. The connecting pads 161A, 162A penetrate the passivation layer 180 in the region 101A and electrically connect the S/D electrodes 121A, 122A respectively. The connecting pad 163A penetrates the passivation layer 180 in the region 101A and electrically connects the gate electrode 123A. The connecting pads 171A, 172A penetrate the passivation layer 180 in the region 102A and electrically connect the S/D electrodes 131A, 132A respectively. The connecting pad 173A penetrates the passivation layer 180 in the region 102A and electrically connects the gate electrode 133A.

The passivation layer 180A covers the S/D electrodes 121A, 122A, 131A, 132A and the gate electrodes 123A, 133A for a protection purpose. The exemplary materials of the passivation layer 180A can include, for example but are not limited to, $SiN_x$, $SiO_x$, SiON, SiC, SiBN, SiCBN, oxides, nitrides, or combinations thereof. In some embodiments, the passivation layer 180A is a multi-layered structure, such as a composite dielectric layer of $Al_2O_3/SiN$, $Al_2O_3/SiO_2$, AlN/SiN, AlN/SiO$_2$, or combinations thereof.

The semiconductor device 100A includes a first-type doped gate layers 124A and 134A. The first-type doped gate layer 124A is disposed between the gate electrode 123A and the nitride-based semiconductor layer 104A. The first-type doped gate layer 134A is disposed between the gate electrode 133A and the nitride-based semiconductor layer 104A. For example, the first-type doped gate layers 124A, 134A are doped with p-type dopants. Therefore, the GaN-based HEMT 120A and the GaN-based HEMT 130A can provide a normally-off operation, typically referred to as enhancement mode. The p-type dopants can include, for example but are not limited to, Be, Mg, Zn, Cd.

In some embodiments, the first-type doped gate layers 124A, 134A can be omitted. Therefore, the semiconductor devices in these embodiments can provide a normally-on operation, typically referred to as depletion mode. Alternatively, one device may operate as an enhancement mode device (with a doped layer) and one device may operate as a depletion mode device.

Referring to FIG. 3, the semiconductor device 100A includes connecting pads 191A, 192A. The connecting pad 191A penetrates the passivation layer 180A and electrically connects to the interconnection 140A. The connecting pad 192A penetrates the passivation layer 180A and electrically connects to the interconnection 150A. In some embodiments, each of the connecting pads 191A, 192A may include a via and a metal line. The via can penetrate the passivation layer 180A and electrically connect to the interconnection 140A. The metal line is disposed on the passivation layer 180A and in contact with the via. The via and the metal line may include metals or metal compounds. The exemplary materials of the metals or metal compounds can include, for example but are not limited to, W, Au, Pd, Ti, Ta, Co, Ni, Pt, Mo, TiN, TaN, metal alloys thereof, or other metallic compounds.

The interconnection 140A penetrates the nitride-based semiconductor layers 103A, 104A with extending along sidewalls of the nitride-based semiconductor layers 103A, 104A. A bottom most portion 142A of the interconnection 140A forms the interface 141A. A bottom most portion 152A of the interconnection 150A forms the interface 151A. The interconnections 140A and 150A can be electrically coupled to external pads through the connecting pads 191A, 192A, respectively. For example, the connecting pads 191A, 192A can be electrically coupled to different voltage sources.

Figure 4:
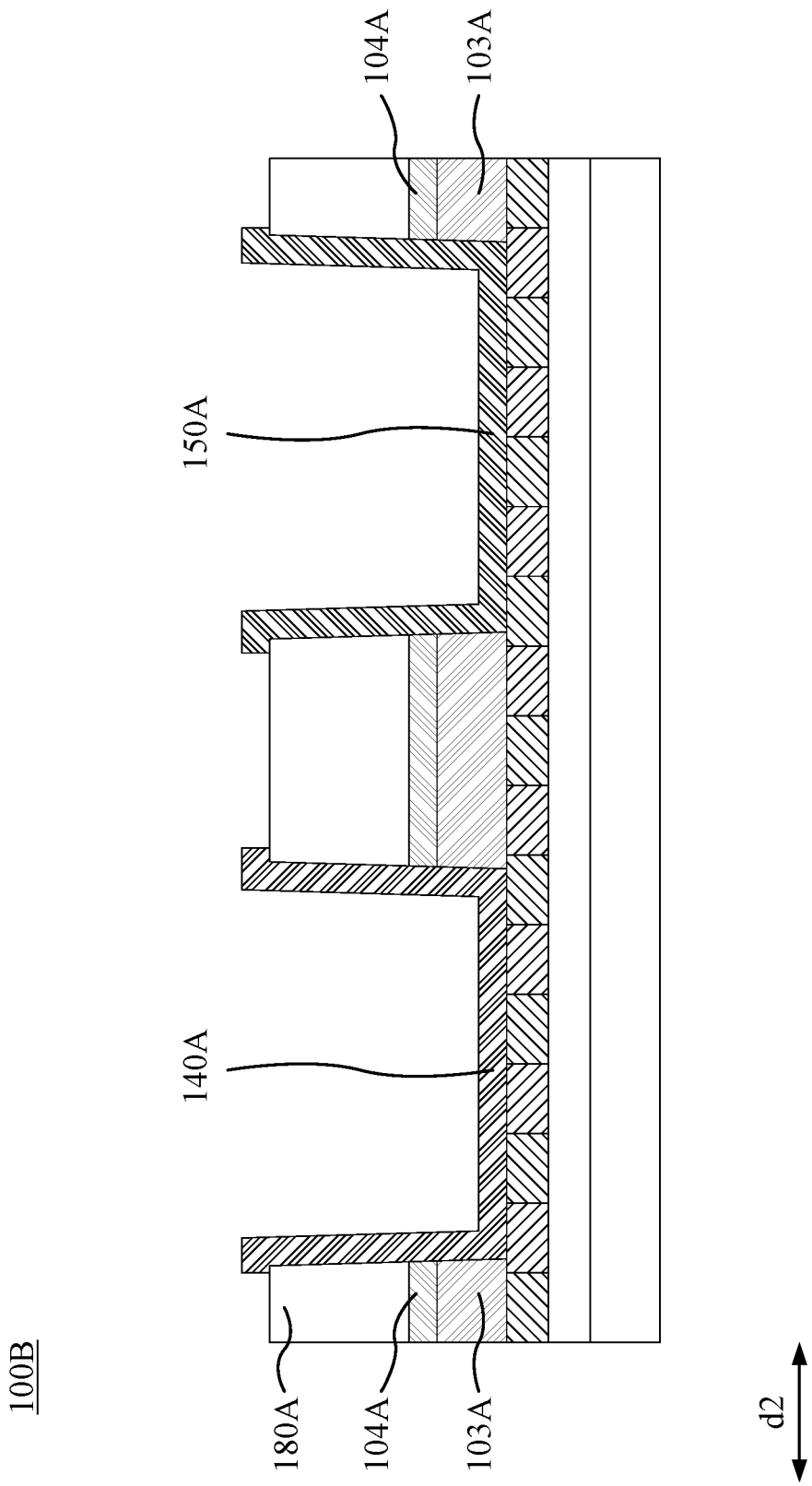
FIG. 4 is a side sectional view of a semiconductor device according to some embodiments of the present disclosure.

FIG. 4 is a side section view of a semiconductor device according to some embodiments of the present disclosure. In some embodiments, the interconnections 140A, 150A may penetrate the passivation layer 180A, the nitride-based semiconductor layer 104A, and the nitride-based semiconductor layer 103A. In some embodiments, the interconnections 140A, 150A may have portions over the passivation layer 180A.

Figure 5:
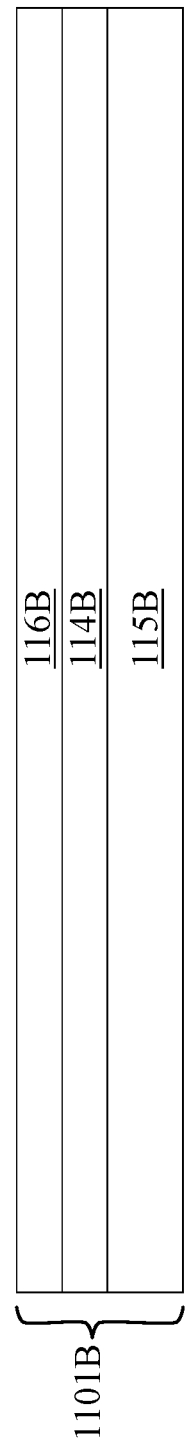
FIGS. 5 to 11 are side sectional views of manufacturing method of semiconductor device of some embodiments of the present disclosure.

FIGS. 5 to 11 are side sectional views of manufacturing method of semiconductor device 100B according to some embodiments of the present disclosure. Referring to FIG. 5, the manufacturing method of this embodiment includes providing a undoped substrate 1101B. The undoped substrate 1101B has a base layer 115B, an insulating layer 114B, and a undoped layer 116B. The insulating layer 114B is disposed on the base layer 115B. The undoped layer 116B is disposed on the insulating layer 114B. In some embodiments of the present disclosure, a nucleation layer is disposed on the insulating layer. The undoped layer 116B is disposed on the nucleation layer. In some embodiments, the undoped layer 116B includes nitrides or group III-V compounds. In some embodiments, the undoped layer 116B may include, for example but are not limited to, GaN, AlN, InN, $In_xAl_yGa_{(1-x-y)}N$ where $x+y \leq 1$, $Al_yGa_{(1-y)}N$ where $y \leq 1$. For example, the undoped layer 116B is an undoped GaN layer. In some embodiments, the formation of the undoped layer 116B may include forming a buffer layer for reducing a difference in thermal coefficient or lattice number.

Figure 6:
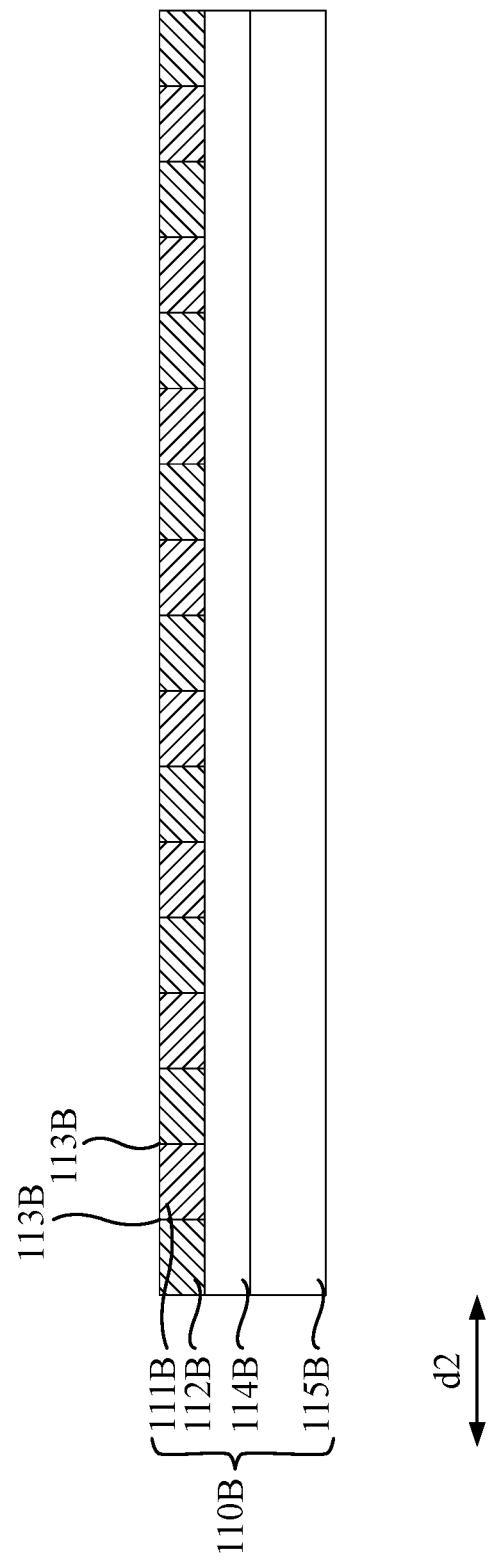

Referring to FIG. 6, the manufacturing method of the embodiment includes forming a plurality of first-type doped semiconductor regions 111B and second-type doped semiconductor regions 112B with a plurality of junctions 113B in a substrate 110B. In some embodiments, the formation of the first-type doped semiconductor regions 111B and second-type doped semiconductor regions 112B is achieved by at least one doping process. In one aspect, the initially undoped layer 116B can be doped with the second dopant after the first-type doped semiconductor regions 111B are doped with the first dopant, and vice versa. The first-type doped semiconductor regions 111B and second-type doped semiconductor regions 112B are alternately arranged along the second direction d2. The junctions 1113B are formed among the first-type doped semiconductor regions 111B and second-type doped semiconductor regions 112B. For example, the first-type doped semiconductor regions 111B are formed by doping p-type dopants. The second-type doped semiconductor regions 112B are formed by doping n-type dopants.

Figure 7:
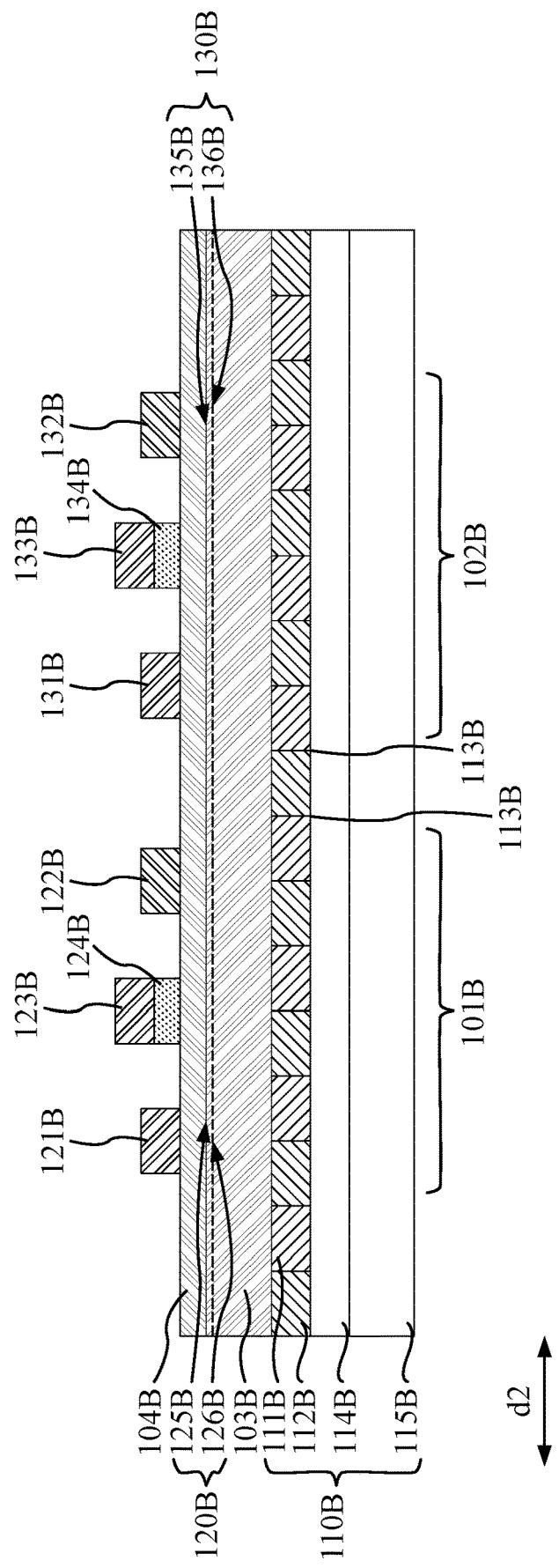

Referring to FIG. 7, the manufacturing method of the embodiment includes forming a nitride-based semiconductor layer 103B above the substrate 110B; forming a nitride-based semiconductor layer 104B on the nitride-based semiconductor layer 103B. the nitride-based semiconductor layer 104B has a bandgap greater than a bandgap of the nitride-based semiconductor layer 103B.

For example, a material of the nitride-based semiconductor layer 103B may include GaN. A material of the nitride-based semiconductor layer 104B may include AlGaN. A heterojunction is formed between the nitride-based semiconductor layer 103B and the nitride-based semiconductor layer 104B, and a 2DEG is formed. In some embodiments, prior to the formation of the nitride-based semiconductor layer 103B, the manufacturing method of the embodiment may further include forming a nucleation layer or a buffer layer for reducing a difference in thermal coefficient or lattice number. The material of the nucleation layer or the buffer layer can be selected according to the properties of the substrate 110B and the nitride-based semiconductor layer 103B.

The manufacturing method of the embodiment further includes forming a pair of S/D electrodes 121B, 122B and a pair of S/D electrodes 131B, 132B on the nitride-based semiconductor layer 104B; forming a gate electrode 123B and a gate electrode 133B on the nitride-based semiconductor layer 104B. The gate electrode 123B is present between the S/D electrodes 121B, 122B. The gate electrode 133B is present between the S/D electrodes 131B, 132B.

The S/D electrodes 121B, 122B and the gate electrode 123B are disposed on the region 101B on the substrate 110B. The heterojunction in the region 101B is the heterojunction area 125B. The 2DEG in the region 101B is the 2DEG region 126B. The 2DEG region 126B is adjacent to the heterojunction area 125B.

The S/D electrodes 131B, 132B and the gate electrode 13B are disposed on the region 102B on the substrate 110B. The heterojunction in the region 102B is the heterojunction area 135B. The 2DEG in the region 102B is the 2DEG region 136B. The 2DEG region 136B is adjacent to the heterojunction area 135B.

Figure 8:
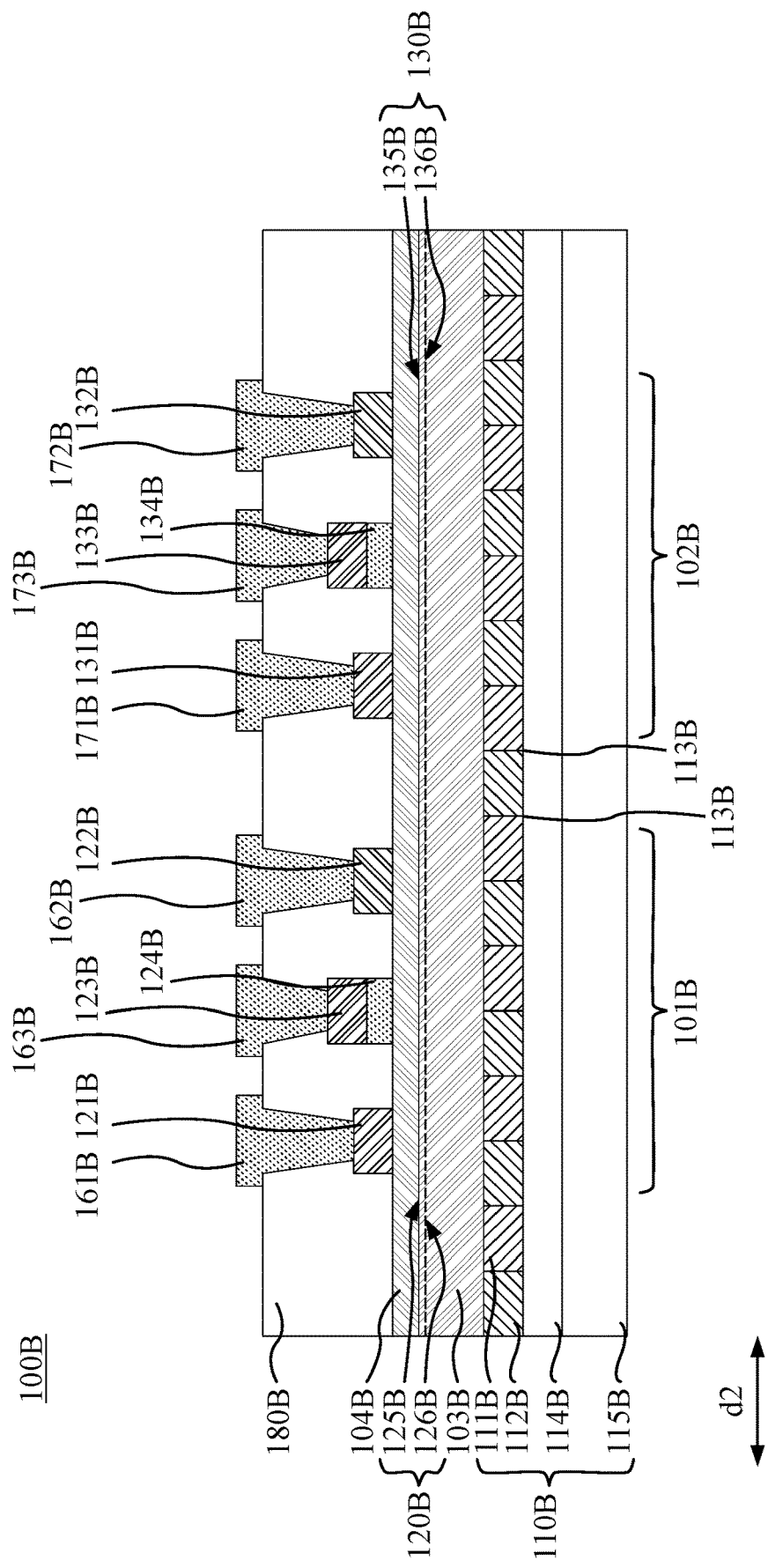

Referring to FIG. 8, the manufacturing method of the embodiment includes disposing a passivation layer 180B with a plurality of connecting pads 161B, 162B, 163B, 171B, 172B, and 173B. The connecting pads 161B, 162B, 163B, 171B, 172B, and 173B are electrically connected to the S/D electrodes 121B, 122B, the gate electrode 123B, the S/D electrodes 131B, 132B, and the gate electrode 133B. Therefore, a HEMT part of the semiconductor device 100B is formed.

The semiconductor device 100B includes a first-type doped gate layers 124B and 134B. The first-type doped gate layer 124B is disposed between the gate electrode 123B and the nitride-based semiconductor layer 104B. The first-type doped gate layer 134B is disposed between the gate electrode 133B and the nitride-based semiconductor layer 104B.

Figure 9:
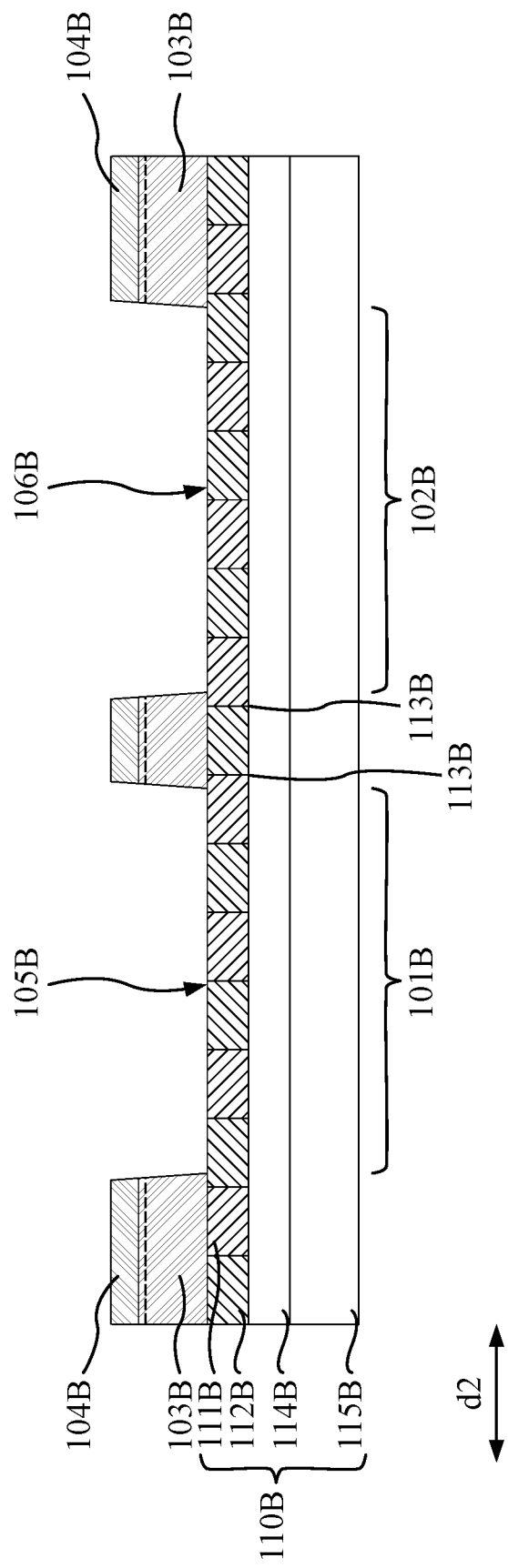

Referring to FIG. 9, on the other part of the substrate 110B, the manufacturing method of the embodiment includes removing portions of the nitride-based semiconductor layer 103B and the nitride-based semiconductor layer 104B to form a trench 105B and a trench 106B separated from each other, so as to expose a top portion of the substrate 110B. I In the second direction d2, the trench 105B and the trench 106 are separated by two junctions 103B of the substrate 110B.

Figure 10:
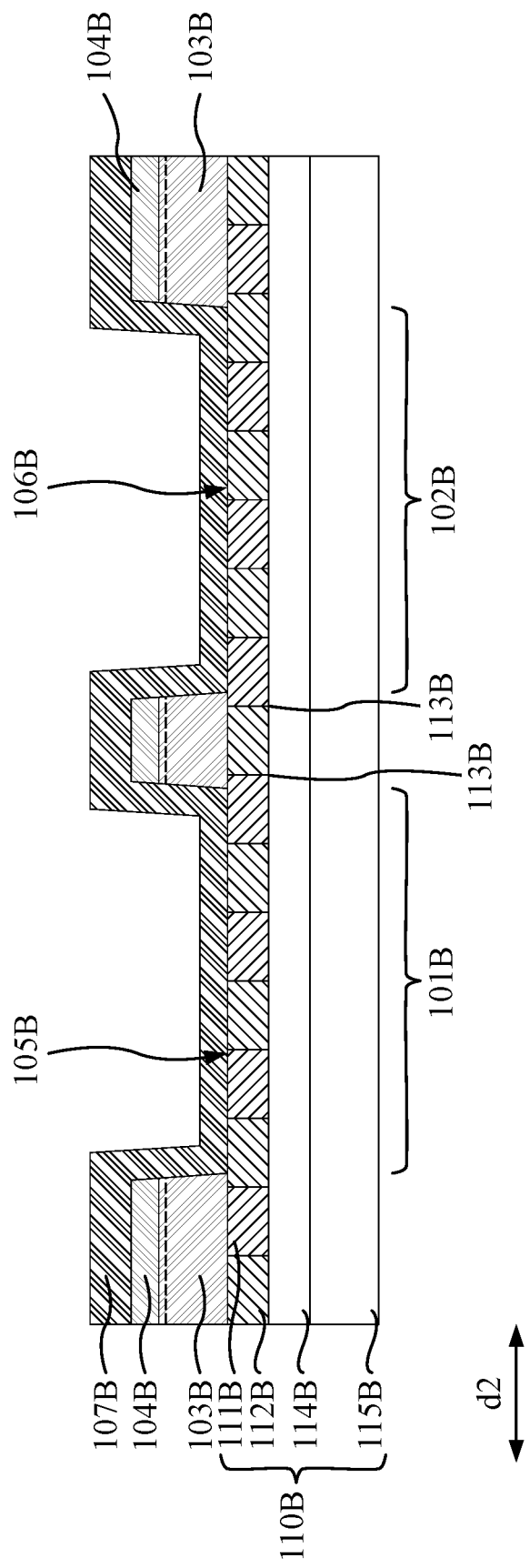
Figure 11:
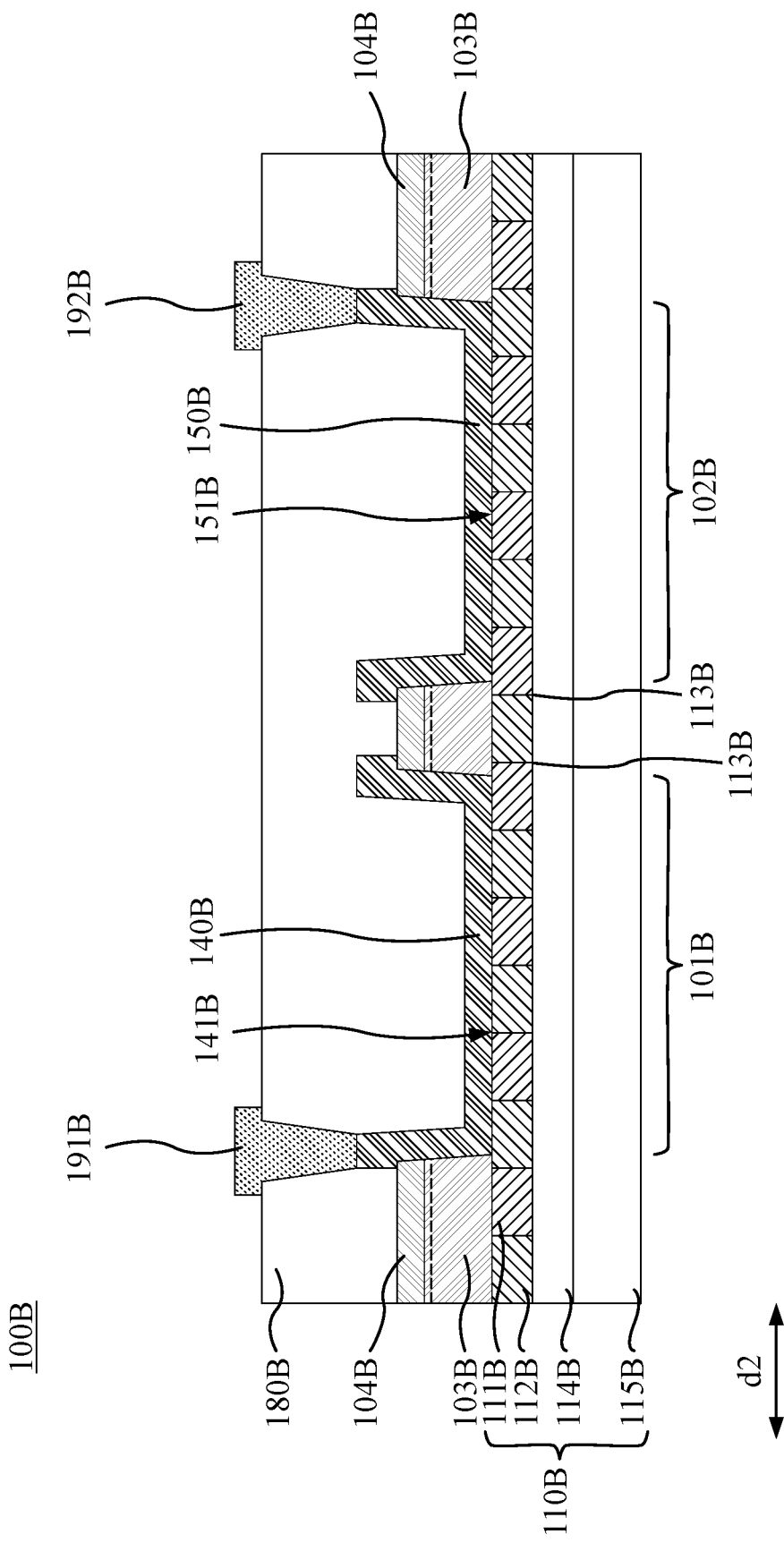

Referring to FIGS. 10 and 11, the manufacturing method of the embodiment includes forming interconnections 140B, 150B in the trenches 105B, 106B, respectively, and in contact with the top portion of the substrate 110B so as to form an interface 141B and an interface 151B, wherein vertical projections of the interfaces 141B, 151B on the substrate 110B are at least separated from each other by at least two of the junctions 113B.

Referring to FIG. 10, forming the interconnections 140B, 150B includes forming a blanket conductive layer 107B above the nitride-based semiconductor layer 104B. Some portions of the blanket conductive layer 107B are present in the trenches 105B, 106B.

Referring to FIG. 11, forming the interconnections 140B, 150B includes patterning the blanket conductive layer 107B to form the interconnections 140B, 150B separated from each other. Also, a passivation layer 180B with connecting pads 191B, 192B is disposed on the interconnections 140B, 150B. Therefore, an interconnection part of the semiconductor device 100B is formed.

Figure 12:
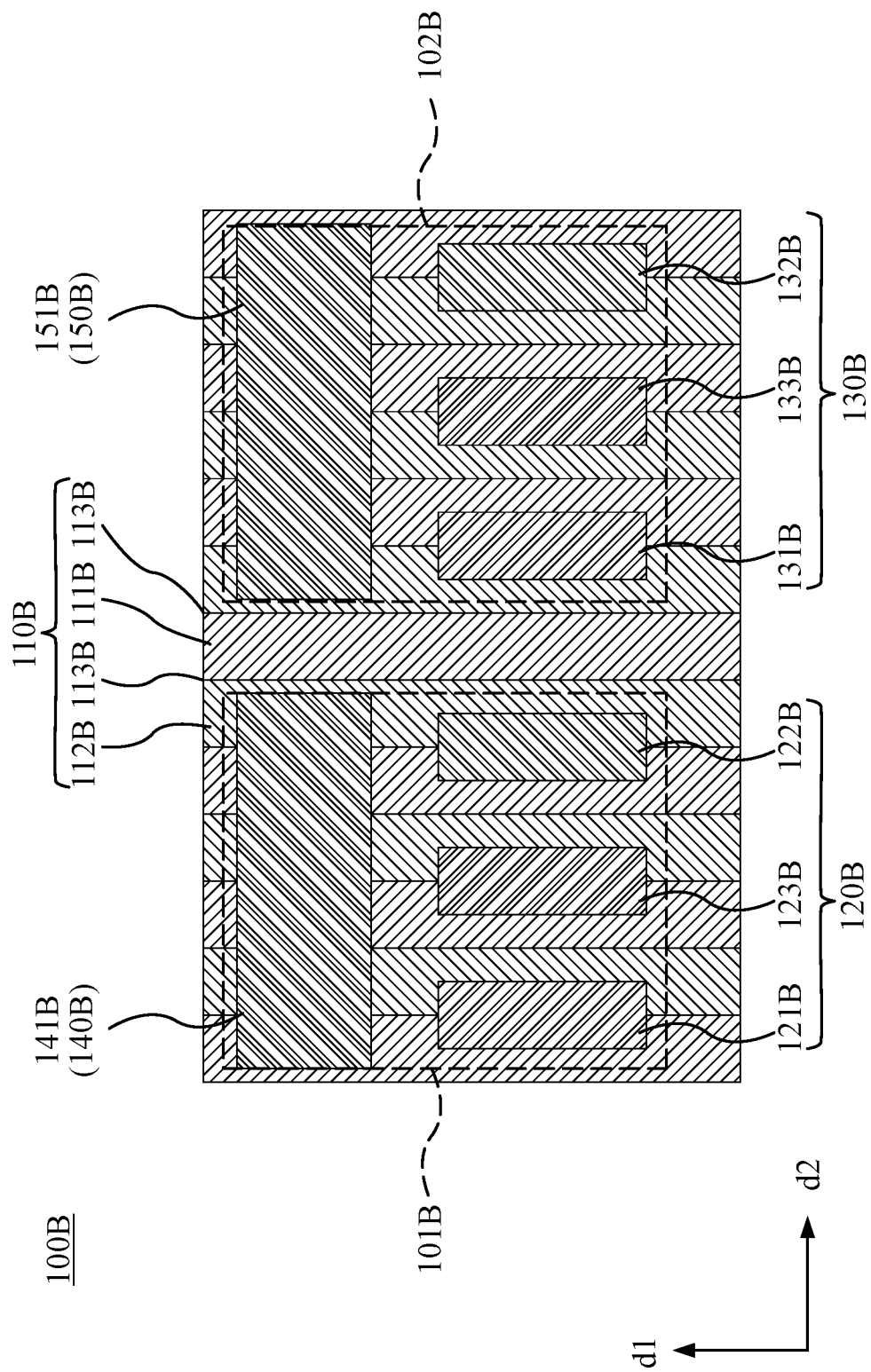
FIG. 12 is a top view of the semiconductor device according to some embodiments of the present disclosure.

For example, referring to FIG. 8, in the embodiment, the junctions 113B of the substrate 110B are p-n junctions. The vertical projection of the portion of the nitride-based semiconductor layer 103B on the substrate 110B spans across two p-n junctions 113B. FIG. 12 is a top view of the semiconductor device 100B according to the embodiment of the present disclosure. Two p-n junctions 113B separate the region 101B and the region 102B. The GaN-based HEMT 120B and the interconnection 140B are disposed in the region 101B. The GaN-based HEMT 130B and the interconnection 150B are disposed in the region 102B.

Figure 13:
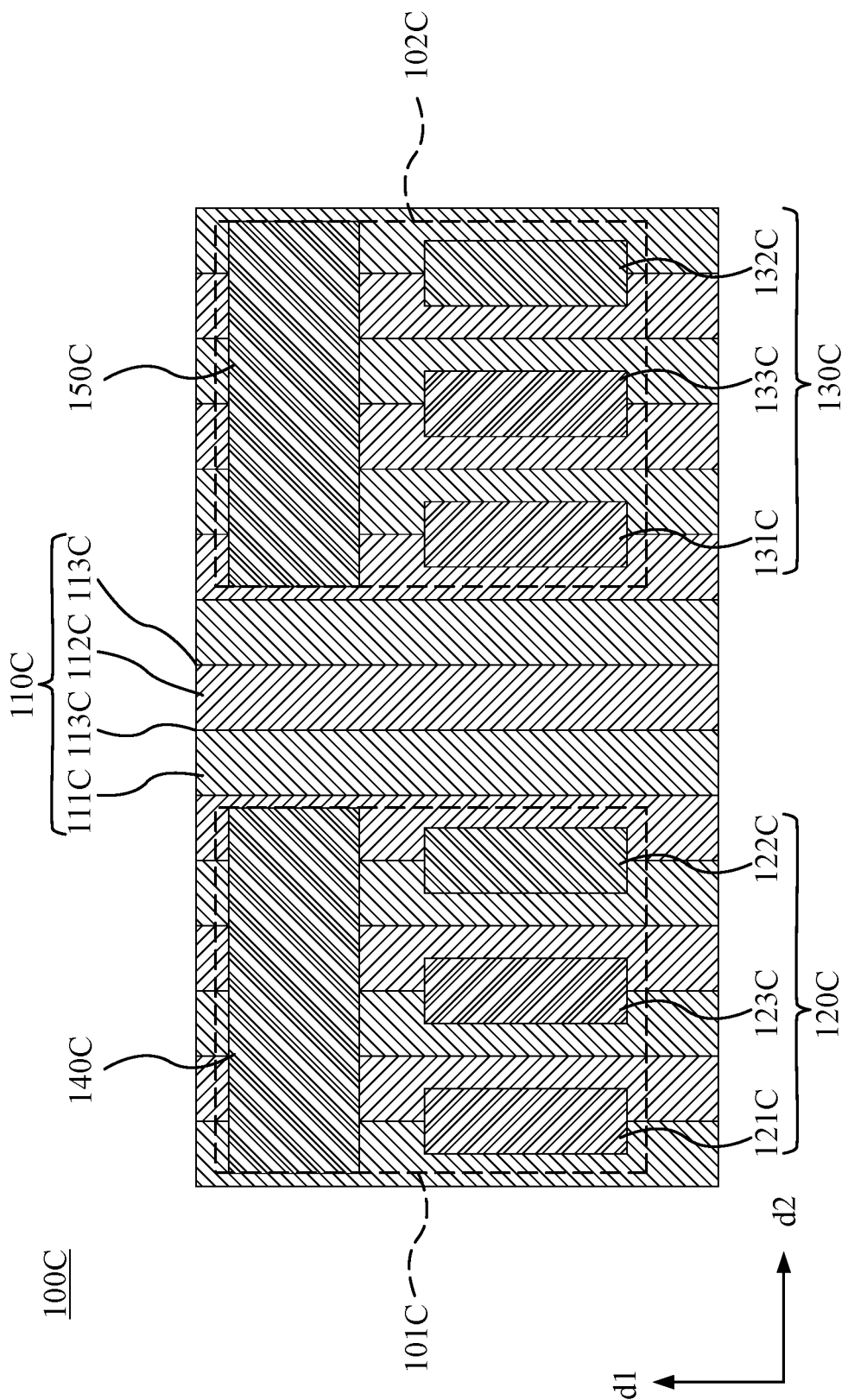
FIG. 13 is a top view of a semiconductor device according to some embodiments of the present disclosure.

FIG. 13 is a top view of a semiconductor device 100C according to some embodiments of the present disclosure. In another embodiment, GaN-based HEMTs 120C, 130C are similar to the GaN-based HEMTs 120A, 130A. On the substrate 110C, the interconnection 140C, the S/D electrodes 121C, 122C, and the gate electrode 123C are disposed in the region 101C, and the interconnection 150C, the S/D electrodes 131C, 132C, and the gate electrode 133C are disposed in the region 102C.

In this embodiment, the first-type doped semiconductor regions 111C are doped with n-type dopants. The second-type doped semiconductor regions 112C are doped with p-type dopants. A plurality of junctions 113C are formed among the first-type doped semiconductor regions 111C and the second-type doped semiconductor regions 112C.

Figure 14:
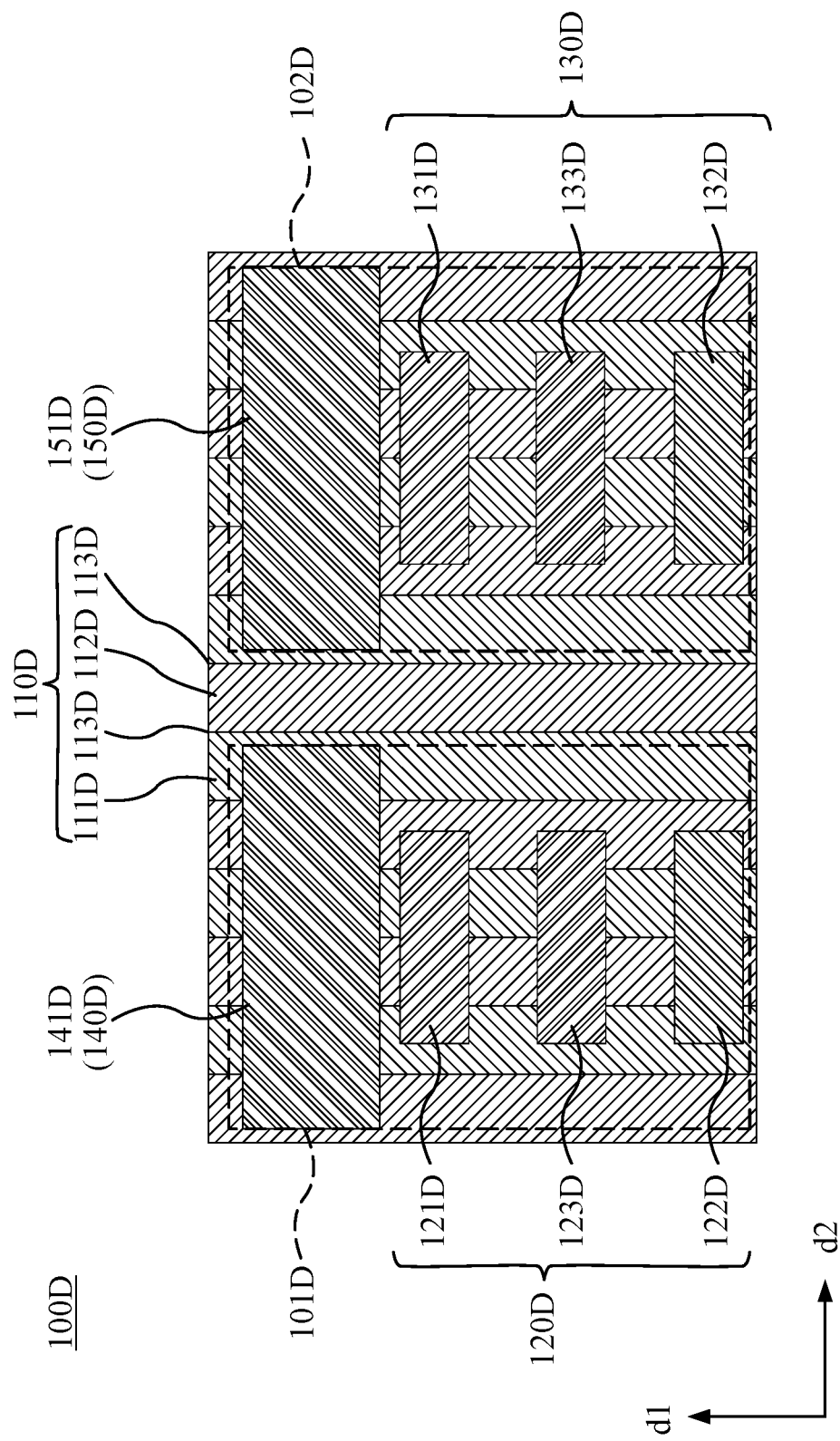
FIG. 14 is a top view of a semiconductor device according to some embodiments of the present disclosure.

FIG. 14 is a top view of a semiconductor device 100D according to some embodiments of the present disclosure. In the embodiment, the GaN-based HEMT 120D includes a pair of S/D electrodes 121D, 122D arranged along the first direction d1. The interface 141D of the interconnection 140D and vertical projections of the S/D electrodes 121D, 122D on the substrate 110D are arranged along the first direction d1. The first-type doped semiconductor regions 111D, the second-type doped semiconductor regions 112D, and the junctions 113D extend along the first direction d1.

The GaN-based HEMT 130D includes a pair of S/D electrodes 131D, 132D arranged along the first direction d1. The interface 151D of the interconnection 150D and vertical projections of the S/D electrodes 131D, 132D on the substrate 110D are arranged along the first direction d1.

Figure 15:
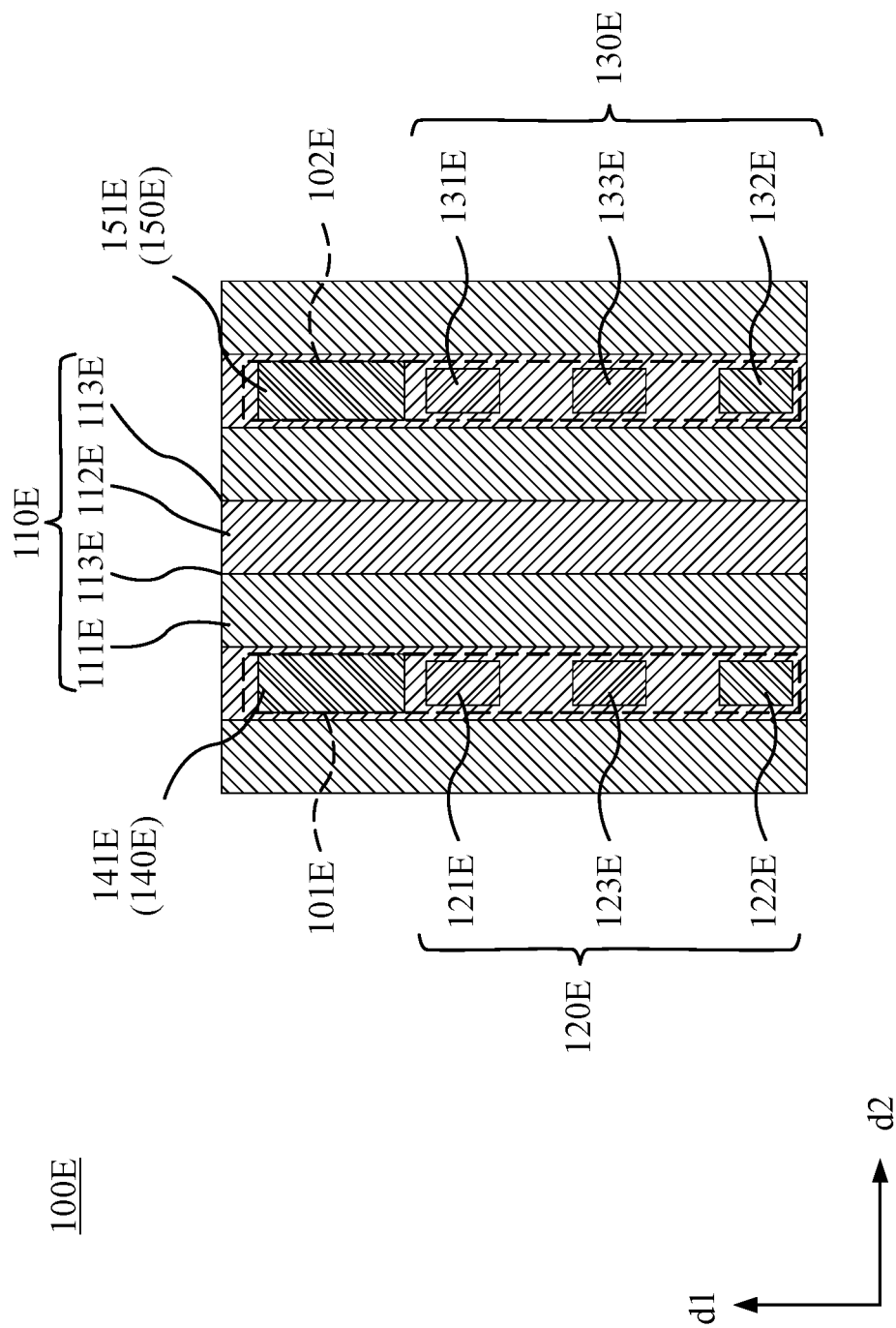
FIG. 15 is a top view of a semiconductor device according to some embodiments of the present disclosure.

FIG. 15 is a top view of a semiconductor device 100E according to some embodiments of the present disclosure. In the embodiment, the GaN-based HEMT 120E includes a pair of S/D electrodes 121E, 122E and gate electrode 123E arranged along the first direction d1. The interface 141E of the interconnection 140E and vertical projections of the S/D electrodes 121E, 122E on the substrate 110E are within one of the plurality of first-type doped semiconductor regions 111E and second-type doped semiconductor regions 112E. In other words, the interface 141E and the vertical projections of the S/D electrodes 121E, 122E on the substrate 110E are located between two junctions 113E.

The GaN-based HEMT 130E includes a pair of S/D electrodes 131E, 132E and gate electrode 133E arranged along the first direction d1. The interface 151E of the interconnection 150E and vertical projections of the S/D electrodes 131E, 132E on the substrate 110E are within one of the firs-type dopes region 111E and second-type doped semiconductor regions 112E. In other words, the interface 151E and the vertical projections of the S/D electrodes 131E, 132E on the substrate 110E are located between two junctions 113E.

Figure 16:
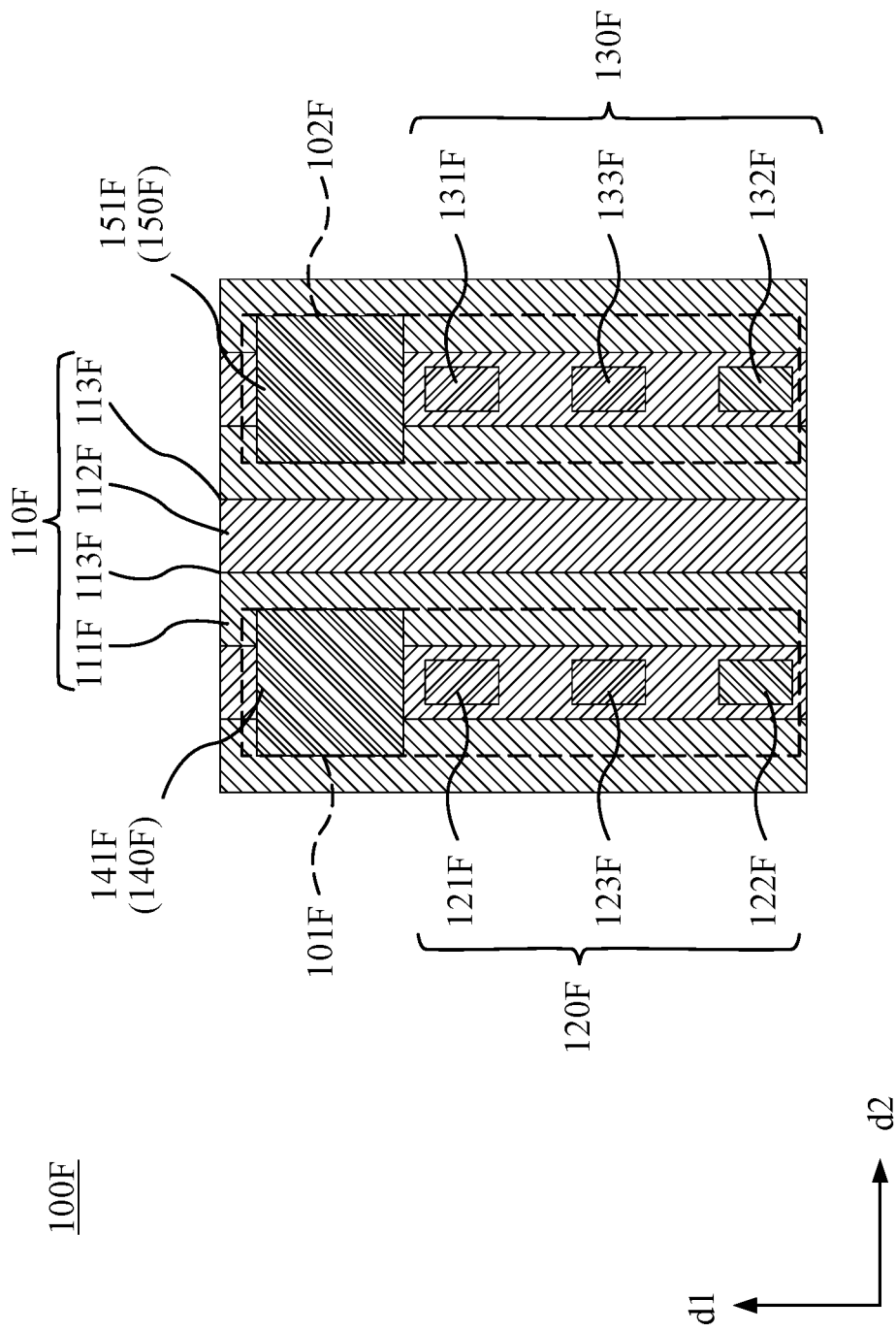
FIG. 16 is a top view of a semiconductor device according to some embodiments of the present disclosure.

FIG. 16 is a top view of a semiconductor device 100F according to some embodiments of the present disclosure. In the embodiment, the GaN-based HEMT 120F includes a pair of S/D electrodes 121F, 122F and gate electrode 123F arranged along the first direction d1. The S/D electrodes 121F, 122F and the gate electrode 123F are similar to the S/D electrodes 121E, 122E and gate electrode 123E. The interface 141F of the interconnection 140F spans across two junctions 113F. The S/D electrodes 121F, 122F and the gate electrode 123F are disposed on one of the first-type doped semiconductor region 111F or second-type doped semiconductor region 112F between the two junctions 113F in the first direction d1.

The GaN-based HEMT 130F includes a pair of S/D electrodes 131F, 132F and gate electrode 133F arranged along the first direction d1. The S/D electrodes 131F, 132F and the gate electrode 133F are similar to the S/D electrodes 131E, 132E and gate electrode 133E. The interface 151F of the interconnection 150F spans across two junctions 113F. The S/D electrodes 131F, 132F and the gate electrode 133F are disposed on one of the first-type doped semiconductor region 111F or second-type doped semiconductor region 112F between the two junctions 113F.

Figure 17:
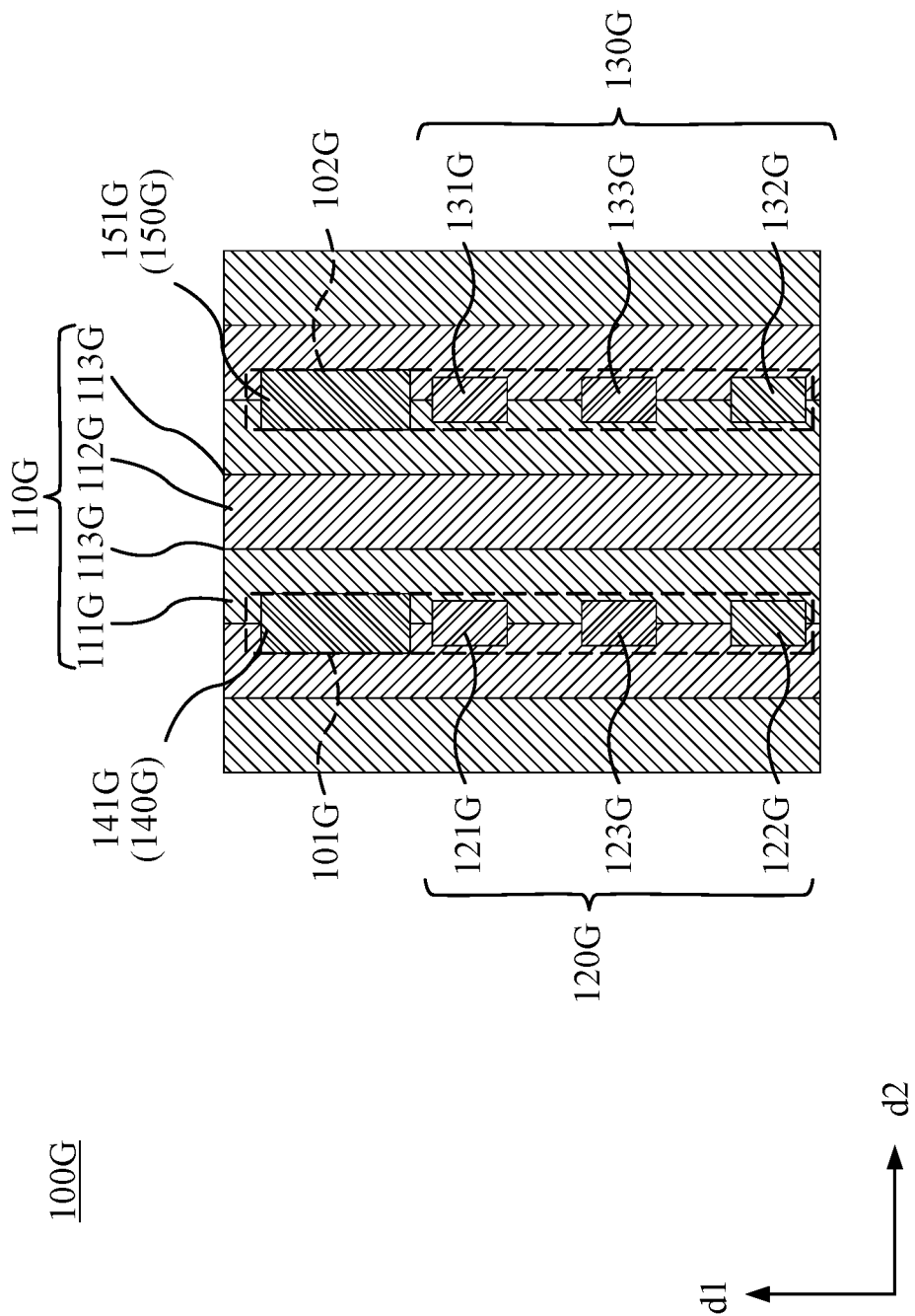
FIG. 17 is a top view of a semiconductor device according to some embodiments of the present disclosure.

FIG. 17 is a top view of a semiconductor device 100G according to some embodiments of the present disclosure. In the embodiment, the GaN-based HEMT 120G includes a pair of S/D electrodes 121G, 122G and gate electrode 123G arranged along the first direction d1. The S/D electrodes 121G, 122G and gate electrode 123G are disposed on one of the junctions 113G formed among the first-type doped semiconductor regions 111G and the second-type doped semiconductor regions 112G of the substrate 110G.

The GaN-based HEMT 130G includes a pair of S/D electrodes 131G, 132G and gate electrode 133G arranged along the first direction d1. The S/D electrodes 131G, 132G and gate electrode 133G are disposed on one of the junctions 113G form among the first-type doped semiconductor regions 111G and the second-type doped semiconductor regions 112G of the substrate 110G.

Figure 18:
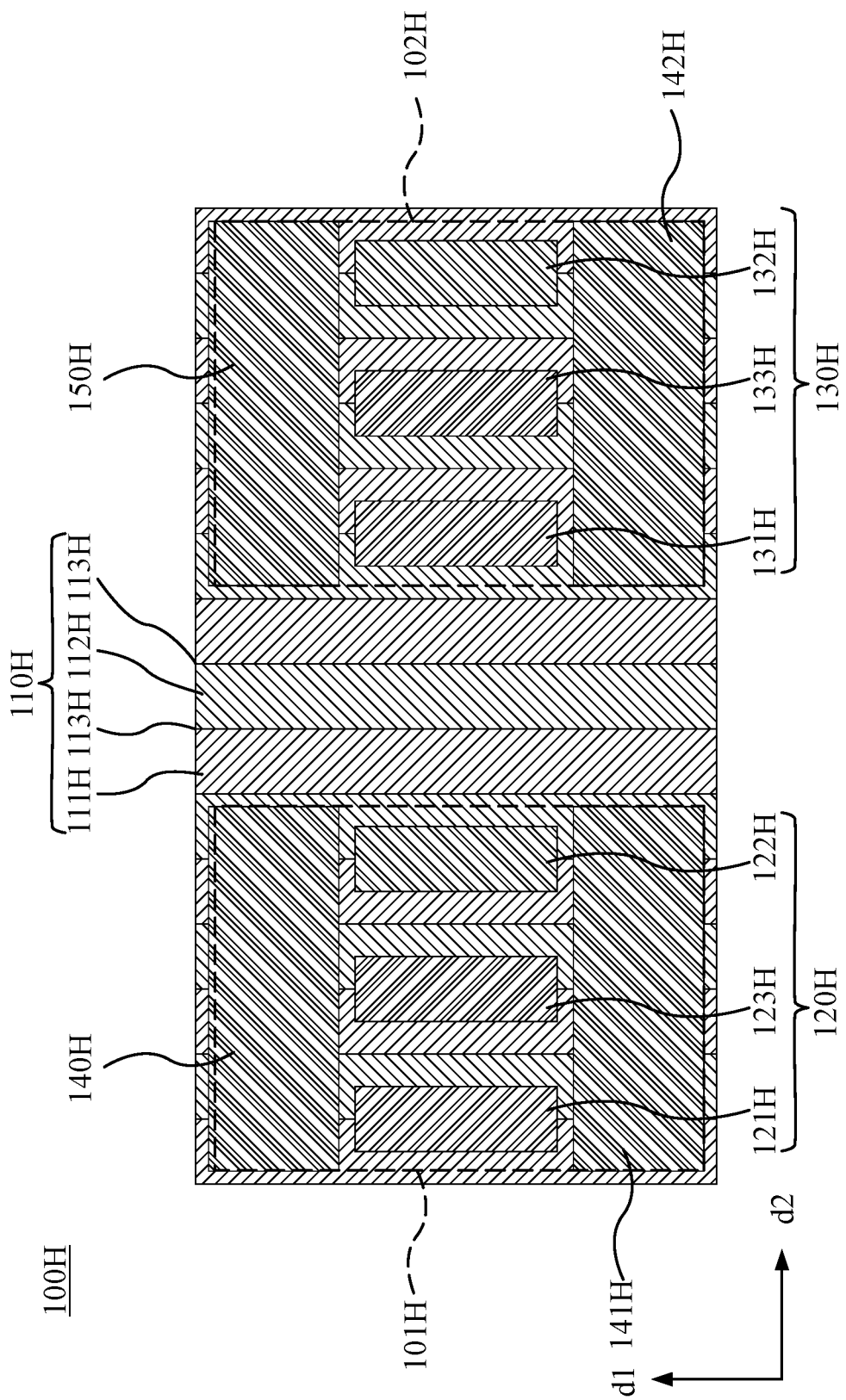
FIG. 18 is a top view of a semiconductor device according to some embodiments of the present disclosure.

FIG. 18 is a top view of a semiconductor device 100H according to some embodiments of the present disclosure. In the embodiment, the GaN-based HEMT 120H includes a pair of S/D electrodes 121H, 122H and gate electrode 123H arranged along the second direction d2. In the first direction d1, the GaN-based HEMT 120H is disposed between the interconnections 140H and 141H. The interconnections 140H and 141H are arranged along the first direction d1.

The GaN-based HEMT 130H includes a pair of S/D electrodes 131H, 132H and gate electrode 133H arranged along the second direction d2. In the first direction d1, the GaN-based HEMT 130H is disposed between the interconnections 150H and 151H. The interconnections 150H and 151H are arranged along the first direction d1.

In this embodiment, a vertical projection of each of the S/D electrodes 121H, 122H on the interconnection 141H is directly above the interface. The interface is form between the interconnection 141H and the substrate 110H.

Figure 19:
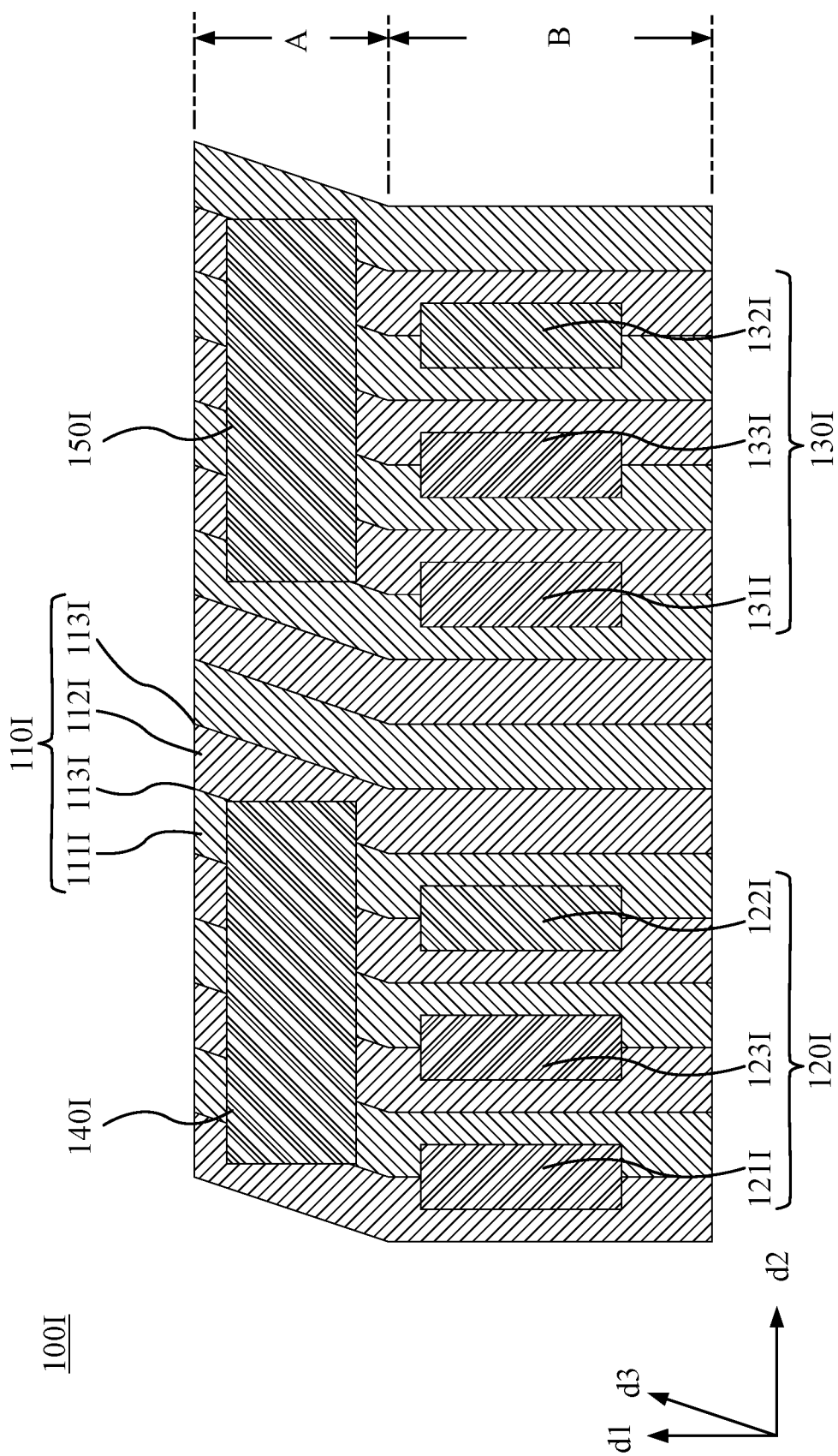
FIG. 19 is a top view of a semiconductor device according to some embodiments of the present disclosure.

FIG. 19 is a top view of a semiconductor device 100I according to some embodiments of the present disclosure. In the embodiment, the substrate 110I has an area A and an area B. The first-type doped semiconductor regions 111I and the second-type doped semiconductor regions 112I in the area A are extending along a third direction d3. The first-type doped semiconductor regions 111I and the second-type doped semiconductor regions 112I in the area B are extending along a first direction d1. The first direction d1 is different from the third direction d3. The GaN-based HEMT 120I includes a pair of S/D electrodes 121I, 122I and gate electrode 123I arranged along the second direction d2. The GaN-based HEMT 130I includes a pair of S/D electrodes 131I, 132I and gate electrode 133I arranged along the second direction d2.

The GaN-based HEMT 120I is disposed in the area A. The GaN-based HEMT 130I is disposed in the area B. The interconnection 140I and the interconnection 150I are disposed in the area A. The GaN-based HEMT 120I and the interconnection 140I span across the same junctions 113I. The GaN-based HEMT 120I and the interconnection 140I span across the same junctions 113I.

Figure 20:
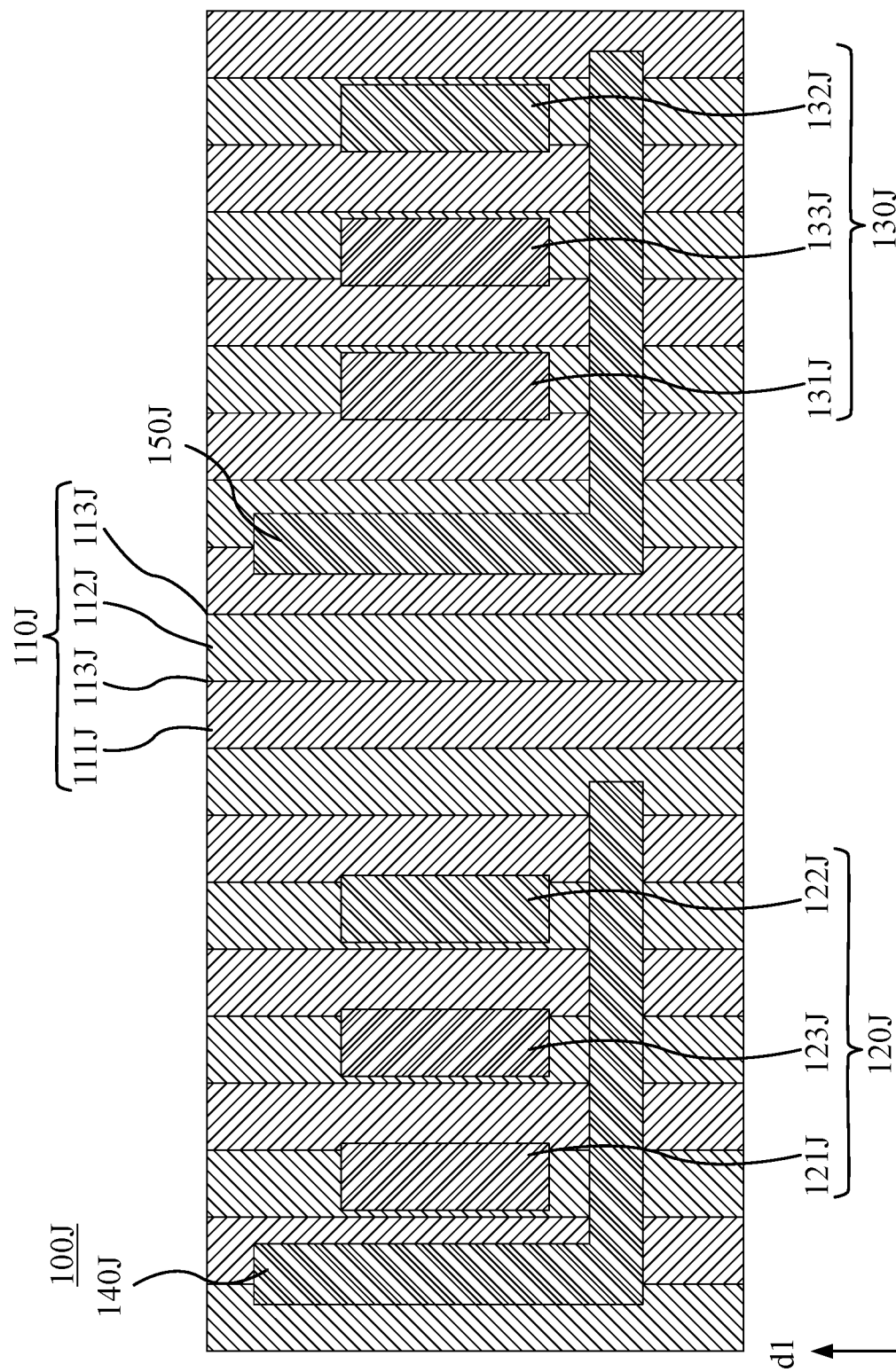
FIG. 20 is a top view of a semiconductor device according to some embodiments of the present disclosure.

FIG. 20 is a top view of a semiconductor device 100J according to some embodiments of the present disclosure. In the embodiment, a vertical projection of the interconnection 140J on the substrate 110J at least has a L-shaped profile. A vertical projection of the interconnection 150J on the substrate 110J at least has a L-shaped profile. The interconnection 140J is adjacent to the S/D electrodes 121J, 122J and the gate electrode 123J of the GaN-based HEMT 120J. The interconnection 150J is adjacent to the S/D electrodes 131J, 132J and the gate electrode 133J of the GaN-based HEMT 130J.

Figure 21:
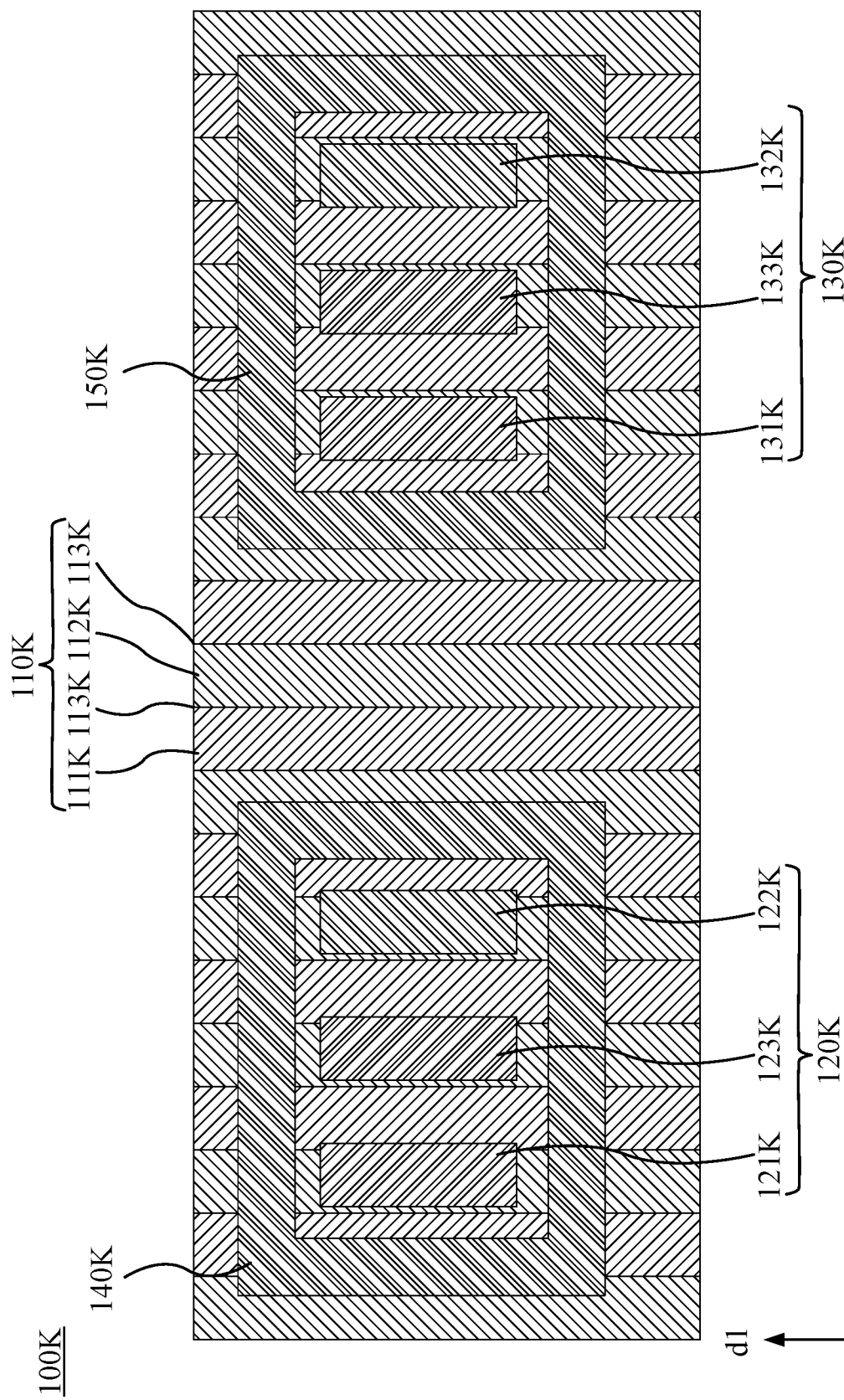
FIG. 21 is a top view of a semiconductor device according to some embodiments of the present disclosure.

FIG. 21 is a top view of a semiconductor device 100K according to some embodiments of the present disclosure. In the embodiment, a vertical projection of the interconnection 140K on the substrate 110K comprises a ring shape, and a vertical projection of the GaN-based HEMT 120K on the substrate 110K is within the ring-shaped vertical projection of the interconnection 140K. A vertical projection of the interconnection 150K on the substrate 110K comprises a ring shape, and a vertical projection of the GaN-based HEMT 130K on the substrate 110K is within the ring-shaped vertical projection of the interconnection 140K. The GaN-based HEMT 120K includes a pair of S/D electrodes 121K, 122K and gate electrode 123K arranged along the second direction d2. The GaN-based HEMT 130K includes a pair of S/D electrodes 131K, 132K and gate electrode 133K arranged along the second direction d2.

Figure 22:
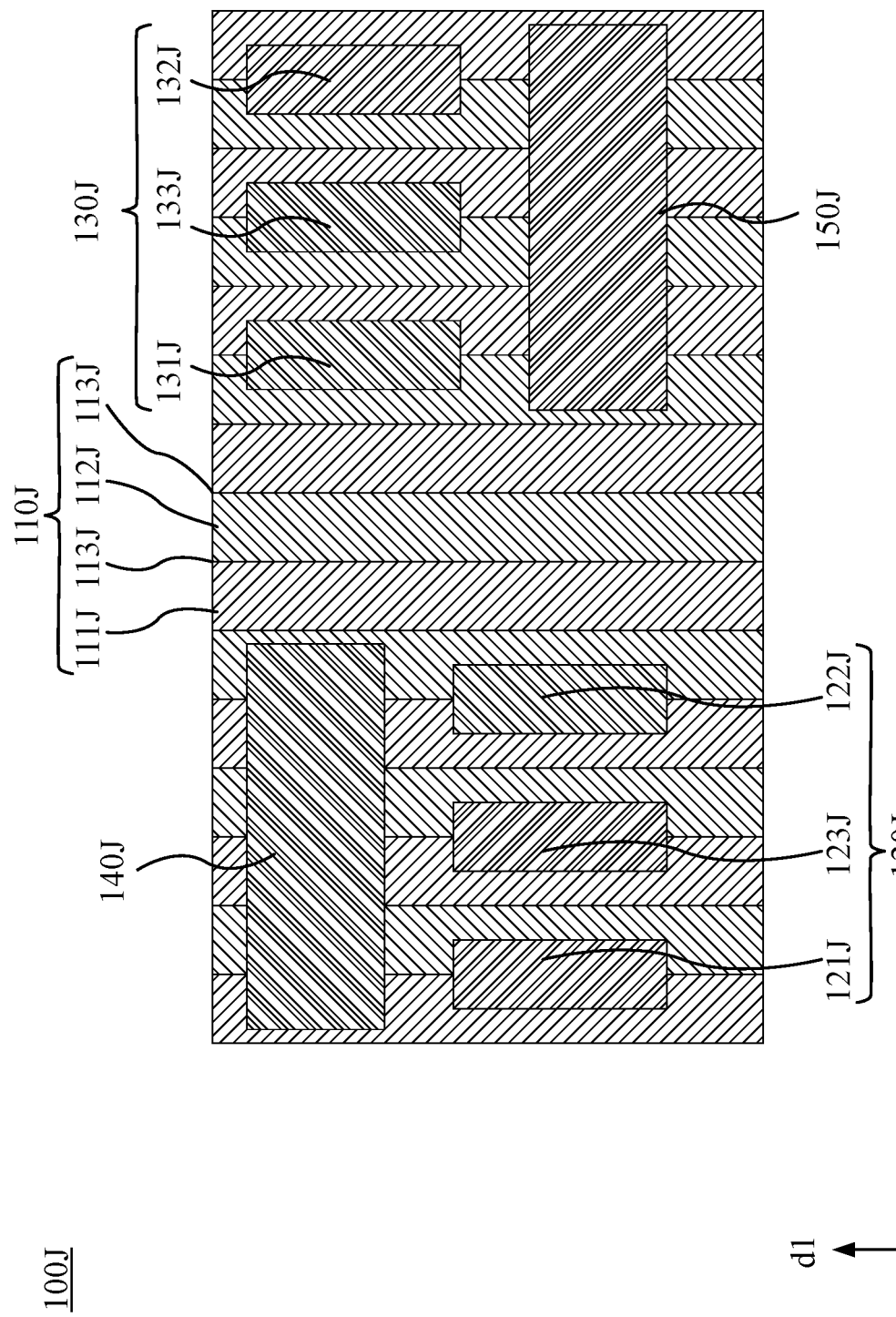
FIG. 22 is a top view of a semiconductor device according to some embodiments of the present disclosure.

FIG. 22 is a top view of a semiconductor device 100J according some embodiments of the present disclosure. In the embodiment, a vertical projection of the interconnection 140J on the substrate 110J is directly above the GaN-based HEMT 120J in the first direction d1. A vertical projection of the interconnection 150J on the substrate 110J is directly below the GaN-based HEMT 130J in the first direction d1. The GaN-based HEMT 120J includes a pair of S/D electrodes 121J, 122J and gate electrode 123J arranged along the second direction d2. The GaN-based HEMT 130J includes a pair of S/D electrodes 131J, 132J and gate electrode 133J arranged along the second direction d2.

Figure 23:
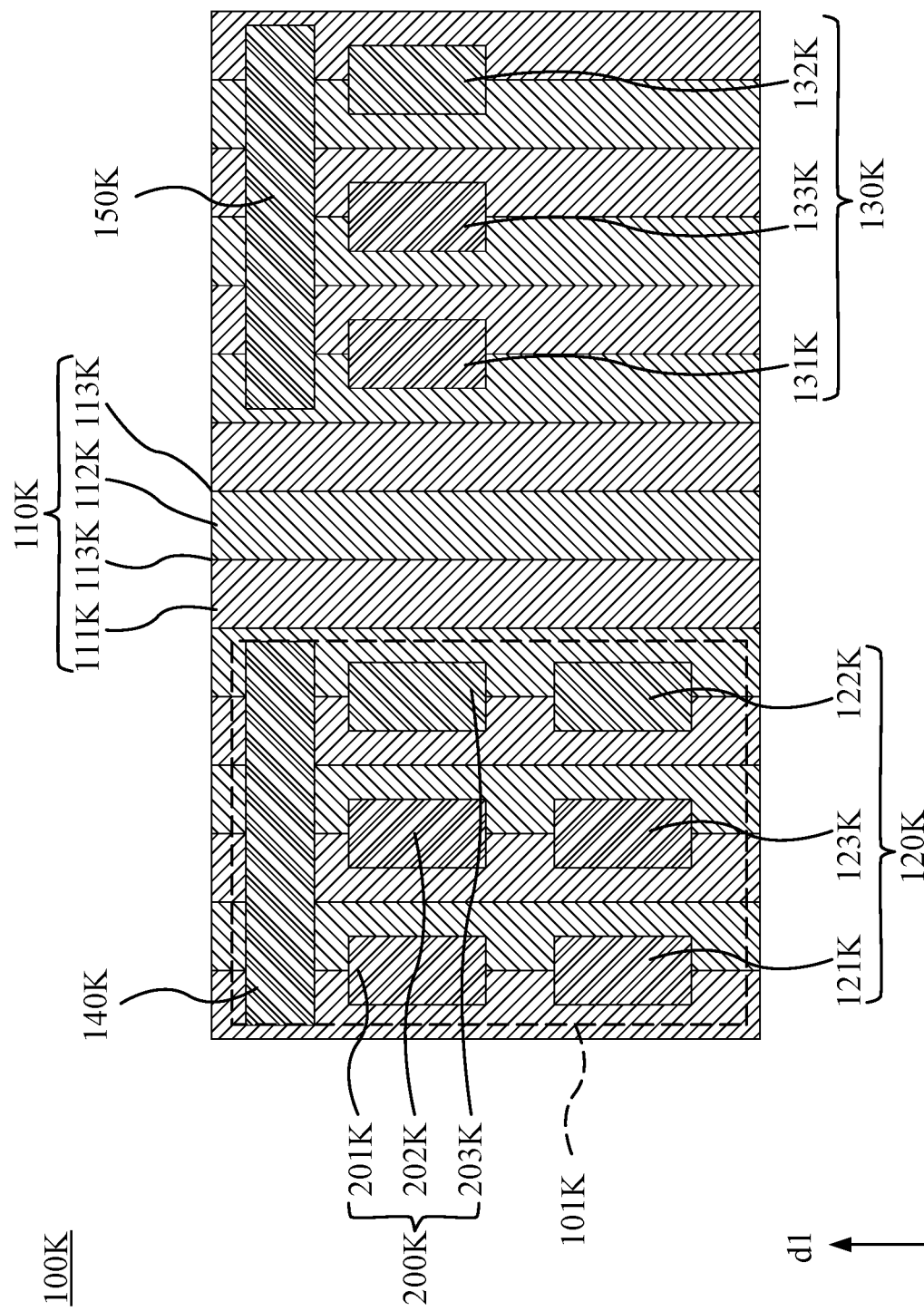
FIG. 23 is a top view of a semiconductor device according to some embodiments of the present disclosure.

FIG. 23 is a top view of a semiconductor device 100K according some embodiments of the present disclosure. In the embodiment, a GaN-based HEMT 200K is disposed on the substrate 110K to cover the region 101K of the plurality of first-type doped semiconductor regions 111K and second-type doped semiconductor regions 112K in the substrate 110K. The GaN-based HEMT 200K including a heterojunction area being disposed between the two nitride-based semiconductor layers with another 2DEG region formed in the region of the heterojunction area.

The GaN-based HEMT 200K has S/D electrodes 201K, 203K, and a gate electrode 202K arranging along the second direction d2. The GaN-based HEMT 120K has S/D electrodes 121K, 122K, and a gate electrode 123K arranging along the second direction d2. The GaN-based HEMT 130K has S/D electrodes 121K, 122K, and a gate electrode 123K arranging along the second direction d2. The GaN-based HEMT 120K and the GaN-based HEMT 200K cover the region 101K. Some of the junctions 113K among the first and second-type doped semiconductor regions 111K, 112K separate the GaN-based HEMT 200K and the GaN-based HEMT 130K.

Although not shown in the drawings, it is understood that additional GaN-based HEMTs may be integrated on a single substrate in the manner described for the devices above such that an arbitrary number of HEMT devices may be integrated in this manner. Furthermore, the above embodiments provide different configurations of the semiconductor devices, which will be advantageous to improve the flexibility. For example, the different configurations of the semiconductor devices can be selected according to process conditions, device sizes, device functions (e.g. low voltage, high voltage, or radio frequency application), or likes. Although not shown in the drawings, it is understood that above different configurations of the semiconductor devices can be integrated into a single chip or a circuit.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:
a substrate having a plurality of first-type doped semiconductor regions and second-type doped semiconductor regions positioned in or over the substrate extending along a first direction and alternately arranged along a second direction different than the first direction;
a first GaN-based high-electron-mobility transistor (HEMT) disposed over the substrate to cover a first portion on the plurality of first-type doped semiconductor regions and second-type doped semiconductor regions, the first GaN-based HEMT including a first heterojunction area being disposed between two nitride-based semiconductor layers with a two-dimensional electron gas (2DEG) region adjacent to the first hetero junction;
a second GaN-based HEMT disposed over the substrate to cover a second portion on the plurality of first-type doped semiconductor regions and second-type doped semiconductor regions, the second GaN-based HEMT including a second heterojunction area being disposed between the two nitride-based semiconductor layers with another 2DEG region adjacent to the second heterojunction, wherein the first portion is different from the second portion;
a first interconnection disposed over the substrate, the first interconnection passing through the two nitride-based semiconductor layers and electrically connected to the doped semiconductor regions, wherein the doped semiconductor region has a portion forming a first interface with the first interconnection; and
a second interconnection disposed over the substrate, the second interconnection passing through the two nitride-based semiconductor layers and electrically connected to the doped semiconductor region, wherein the doped semiconductor region has a portion forming a second interface with the second interconnection, and wherein the first interface is separated from the second interface by at least two junctions formed in the doped semiconductor regions.

2. The semiconductor device of claim 1, wherein the first-type doped semiconductor regions comprise p-type or n-type dopants.

3. The semiconductor device of claim 2, wherein the second-type doped semiconductor regions comprises p-type or n-type dopants.

4. The semiconductor device of claim 1, wherein the at least two junctions comprise two p-n junctions.

5. The semiconductor device of claim 4, wherein the at least two junctions comprise a p-n-p structure.

6. The semiconductor device of claim 1, wherein the first GaN-based HEMT comprises a pair of source/drain (S/D) electrodes arranged along the second direction with a source-drain spacing, and the first interface has a length along the second direction greater than the source-drain spacing.

7. The semiconductor device of claim 1, wherein the first GaN-based HEMT comprises a pair of first source/drain (S/D) electrodes arranged along the second direction and the second GaN-based HEMT comprises a pair of second S/D electrodes arranged along the second direction, and the shortest distance from the first interconnection to the second interconnection is less than the shortest distance from the first S/D electrodes to the second S/D electrodes.

8. The semiconductor device of claim 1, wherein the first GaN-based HEMT comprises a pair of source/drain (S/D) electrodes arranged along the first direction, and the first interface and vertical projections of the S/D electrodes on the substrate are within one of the plurality of first-type doped semiconductor regions and second-type doped semiconductor regions.

9. The semiconductor device of claim 1, wherein the first GaN-based HEMT comprises a pair of source/drain (S/D) electrodes arranged along the first direction, and a vertical projection of each of the S/D electrodes on the first interconnection is directly above the first interface.

10. The semiconductor device of claim 1, further comprising:
a third GaN-based HEMT disposed on the substrate to cover the first portion of the plurality of first-type doped semiconductor regions and second-type doped semiconductor regions in the substrate, the third GaN-based HEMT including a third heterojunction area being disposed between the two nitride-based semiconductor layers with another 2DEG region formed in the region of the third heterojunction area.

11. The semiconductor device of claim 1, wherein a vertical projection of the first interconnection on the substrate at least has a L-shaped profile.

12. The semiconductor device of claim 1, wherein a vertical projection of the first interconnection on the substrate comprises a ring shape, and a vertical projection of the first GaN-based HEMT on the substrate is within the ring-shaped vertical projection of the first interconnection.

13. A semiconductor device, comprising:
a substrate having a plurality of first-type doped semiconductor regions and second-type doped semiconductor regions alternately arranged;
a first nitride-based semiconductor layer disposed over the substrate;
a second nitride-based semiconductor layer disposed on the first nitride-based semiconductor layer and having a bandgap greater than a bandgap of the first nitride semiconductor layer;
a pair of first source/drain (S/D) electrodes disposed on the second nitride-based semiconductor layer;
a first gate electrode disposed on the second nitride-based semiconductor layer and between the first S/D electrodes;
a pair of second S/D electrodes disposed on the second nitride-based semiconductor layer;
a second gate electrode disposed on the second nitride-based semiconductor layer and between the second S/D electrodes;

a first interconnection disposed over the second nitride-based semiconductor layer and penetrating the first and second nitride-based semiconductor layers to form a first interface with at least one of the doped semiconductor regions; and a second interconnection disposed over the second nitride-based semiconductor layer and penetrating the first and second nitride-based semiconductor layers to form a second interface with at least one of the doped semiconductor regions, wherein the first interface is spaced apart from the second interface, and wherein a vertical projection of a portion of the first nitride-based semiconductor layer on the substrate is between the first and second interfaces and at least spans across a whole one of the first and second type doped semiconductor regions.

14. The semiconductor device of claim 13, wherein the first type doped semiconductor regions comprise p-type or n-type dopants.

15. The semiconductor device of claim 14, wherein the second type doped semiconductor regions comprise p-type or n-type dopants.

16. The semiconductor device of claim 15, wherein the vertical projection of the portion of the first nitride-based semiconductor layer on the substrate spans across two p-n junctions.

17. The semiconductor device of claim 15, wherein the vertical projection of the portion of the first nitride-based semiconductor layer on the substrate spans across a p-n-p structure.

18. The semiconductor device of claim 13, wherein the first and second interconnections penetrate the first and second nitride-based semiconductor layers with extending along sidewalls of the first and second nitride-based semiconductor layers, and bottom-most portions of the first and second interconnections form the first and second interfaces, respectively.

19. The semiconductor device of claim 18, wherein the shortest distance between the bottom-most portions of the first and second interconnection is less than the shortest distance between the first S/D electrodes and the second S/D electrodes.

20. The semiconductor device of claim 18, wherein the plurality of first type doped semiconductor regions and second type doped semiconductor regions are alternately arranged along a direction, the first S/D electrodes are arranged along the direction with a source-drain spacing, and the bottom-most portion of the first interconnection has a length along the direction greater than the source-drain spacing.

21. The semiconductor device of claim 13, wherein the first interconnection viewed in a normal direction to the second nitride-based semiconductor layer has a L-shaped profile.

22. The semiconductor device of claim 13, wherein the first interconnection viewed in a normal direction to the second nitride-based semiconductor layer comprises a ring shape, and the first S/D electrodes and the first gate electrode viewed in the normal direction to the second nitride-based semiconductor layer are within the ring shape of the first interconnection.

23. A method for manufacturing a semiconductor device, comprising:
forming a plurality of first type doped semiconductor regions and second type doped semiconductor regions with a plurality of heterojunctions in a substrate;
forming a first nitride-based semiconductor layer above the substrate;
forming a second nitride-based semiconductor layer on the first nitride-based semiconductor layer, wherein the second nitride-based semiconductor layer has a bandgap greater than a bandgap of the first nitride-based semiconductor layer;
forming a pair of first source/drain (S/D) electrodes and a pair of second S/D electrodes on the second nitride-based semiconductor layer;
forming a first gate electrode and a second gate electrode on the second nitride-based semiconductor layer, wherein the first gate electrode is present between the first S/D electrodes and the second gate electrode is present between the second S/D electrodes;
removing portions of the first nitride-based semiconductor layer and the second nitride-based semiconductor layer to form a first trench and a second trench separated from each other, so as to expose a top portion of the substrate; and
forming first and second interconnections in the first and second trenches, respectively, and in contact with the top portion of the substrate so as to form a first interface and a second interface, wherein vertical projections of the first and second interfaces on the substrate are at least separated from each other by at least two of the junctions.

24. The method of claim 23, wherein the first and second type doped semiconductor regions are formed by doping p-type or n-type dopants.

25. The method of claim 23, wherein forming the first and second interconnections comprises:
forming a blanket conductive layer above the second nitride-based semiconductor layer, wherein some portions of the blanket conductive layer are present in the first and second trenches; and
patterning the blanket conductive layer to form the first and second interconnections separated from each other.

* * * * *